(12) United States Patent
Kinugasa et al.

(10) Patent No.: US 7,916,561 B2
(45) Date of Patent: Mar. 29, 2011

(54) DLL CIRCUIT, IMAGING DEVICE, AND MEMORY DEVICE

(75) Inventors: Norihide Kinugasa, Kyoto (JP); Mitsuhiko Otani, Hyogo (JP); Naohisa Hatani, Kyoto (JP); Takayasu Kitou, Osaka (JP)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 12/332,844

(22) Filed: Dec. 11, 2008

(65) Prior Publication Data
US 2009/0154268 A1    Jun. 18, 2009

(30) Foreign Application Priority Data

Dec. 17, 2007 (JP) ................................. 2007-325234

(51) Int. Cl.
*G11C 7/00* (2006.01)
(52) U.S. Cl. ............... 365/194; 365/76; 365/233.12; 327/144; 327/145; 327/147; 327/149; 327/152; 327/153; 327/158; 327/156; 327/161; 327/163
(58) Field of Classification Search .............. 365/76, 365/194, 233.12; 327/144, 145, 147, 149, 327/152, 153, 158, 156, 161, 163
See application file for complete search history.

(56) References Cited

U.S. PATENT DOCUMENTS

| 5,629,897 | A | | 5/1997 | Iwamoto et al. |
| 5,994,934 | A | | 11/1999 | Yoshimura et al. |
| 6,088,255 | A | * | 7/2000 | Matsuzaki et al. ............ 365/76 |
| 6,144,595 | A | * | 11/2000 | Hirooka et al. ............... 365/201 |
| 6,157,690 | A | * | 12/2000 | Yoneda ........................ 375/376 |
| 6,501,309 | B1 | * | 12/2002 | Tomita ......................... 327/158 |
| 6,522,182 | B2 | * | 2/2003 | Tomita et al. ................. 327/158 |
| 6,894,539 | B2 | * | 5/2005 | Kim .................................. 327/3 |
| 6,987,409 | B2 | | 1/2006 | Kim et al. |
| 7,492,198 | B2 | * | 2/2009 | Suda ............................ 327/158 |
| 2004/0239389 | A1 | | 12/2004 | Matsuno |
| 2005/0231249 | A1 | | 10/2005 | Tani |

FOREIGN PATENT DOCUMENTS

| JP | 08-130464 | 5/1996 |
| JP | 2001-257586 | 9/2001 |
| JP | 2005-020711 | 1/2005 |
| JP | 2005-192164 | 7/2005 |
| JP | 2006-074580 | 3/2006 |

* cited by examiner

*Primary Examiner* — Viet Q Nguyen
(74) *Attorney, Agent, or Firm* — McDermott Will & Emery LLP

(57) ABSTRACT

A variable delay circuit successively delays an input clock to generate a plurality of delayed clocks having different phases. A phase comparison circuit receives a first reference clock, which is either one of the delayed clocks or the input clock, and a second reference clock, which is one of the delayed clocks and whose phase lags behind that of the first reference clock, specifies a validated interval for the second reference clock, and compares the phases of the first and second reference clocks according to voltage levels of the first and second reference clocks only during the validated interval. A delay control circuit controls a delay time in the variable delay circuit according to a result of the comparison obtained by the phase comparison circuit.

11 Claims, 17 Drawing Sheets

DLL CIRCUIT, IMAGING DEVICE, AND MEMORY DEVICE

BACKGROUND OF THE INVENTION

The present invention relates to a DLL circuit, and an imaging device and a memory device each including the DLL circuit, and particularly relates to a function for suppressing transition to an improper lock state.

FIG. 16 illustrates the configuration of a typical DLL circuit. In the DLL circuit, an input clock CKin is successively delayed by n delay elements 900, 900, . . . which form a variable delay circuit 90, thereby generating n delayed clocks CK(1), CK(2), . . . , CK(n) having different phases. A frequency phase comparison circuit 91 compares the phases of the delayed clocks CK(1) and CK(n) based on the timings of the occurrences of rising edges of the delayed clocks CK(1) and CK(n) and outputs a charge signal UP or a discharge signal DN according to the comparison result. In response to the charge signal UP or the discharge signal DN, a charge pump circuit 92 charges or discharges the output voltage of a low-pass filter 93. An increase/decrease in the output voltage of the low-pass filter 93 causes a decrease/increase in delay time in each of the delay elements 900, 900, . . . . In this way, the delay times in the delay elements 900, 900, . . . are increased or decreased in accordance with the phase comparison result, whereby the phases of the delayed clocks CK(1) and CK(n) are locked.

In the DLL circuit, it is important to lock the phases of the delayed clocks CK(1) and CK(n) in a state in which the difference in delay time between the delayed clocks CK(1) and CK(n) is one cycle of the delayed clock CK(1). However, in the DLL circuit, since it is not possible to identify the difference in delay time between the delayed clocks CK(1) and CK(n), the phases of the delayed clocks CK(1) and CK(n) are sometimes locked in a state in which the difference in delay time between the delayed clocks CK(1) and CK(n) is not equal to one cycle (for example, an integral number of cycles greater than 1). To deal with this, typically, the delay times in the delay elements 900 are set to a minimum when phase adjustments are started in the DLL circuit, and then the delay times in the delay elements 900 are controlled in such a manner that the difference in delay time between the delayed clocks CK(1) and CK(n) is gradually increased. By doing such control as this, a proper lock state (i.e., a phase state in which the phases of the delayed clocks CK(1) and CK(n) are locked, and the difference in delay time between the delayed clocks CK(1) and CK(n) is one cycle) is achieved.

Japanese Laid-Open Publication No. 2005-20711 (Patent Document 1) discloses a DLL circuit in which a circuit for detecting an improper lock state (i.e., a phase state in which the phases of the delayed clocks CK(1) and CK(n) are locked, but the difference in delay time between the delayed clocks CK(1) and CK(n) is not one cycle) is provided, and when the improper lock state is detected, delay times in delay elements are minimized.

In the conventional DLL circuit, the frequency phase comparison circuit 91 performs the phase comparison based on the timings of the occurrences of edges of the delayed clocks CK(1) and CK(n). Therefore, when the clock waveforms are disturbed (such as in the case of the presence of disturbance noise or in a case in which the supply of the input clock CKin is temporarily stopped and then started again), at a time t1, the rising edge of the delayed clock CK(1) does not occur, and thus only the rising edge of the delayed clock CK(n) occurs as shown in FIG. 17. Consequently, the discharge signal DN continues to be output until the next rising edge of the delayed clock CK(1) occurs at a time t2. The longer the time interval during which the discharge signal DN is output, the more excessive the delay times in the delay elements 900, 900, . . . . As a result, the difference in delay time between the delayed clocks CK(1) and CK(n) becomes greater than required, and hence the improper lock state is likely to occur as shown at a time t3 in FIG. 17.

Also, in the DLL circuit described in Patent Document 1, since the delay time in each of the delay elements 900, 900, . . . is set to a minimum so as to terminate the improper lock state, the process of gradually increasing the delay times in the delay elements 900, 900, . . . must be performed again from the beginning, and thus the time (the recovery time) required for stabilizing the phase state of the delayed clocks CK(1) and CK(n) in the proper lock state is extended.

SUMMARY OF THE INVENTION

It is therefore an object of the present invention to make transition to the improper lock state less likely to occur to thereby increase the stability of the proper lock state in a DLL circuit.

In an aspect of the present invention, a DLL circuit includes: a variable delay circuit for successively delaying an input clock to generate a plurality of delayed clocks having different phases; a phase comparison circuit for receiving a first reference clock, which is either one of the delayed clocks or the input clock, and a second reference clock, which is one of the delayed clocks and whose phase lags behind that of the first reference clock, specifying a validated interval for the second reference clock, and comparing the phases of the first and second reference clocks according to voltage levels of the first and second reference clocks only during the validated interval; and a delay control circuit for controlling a delay time in the variable delay circuit according to a result of the comparison obtained by the phase comparison circuit.

In the DLL circuit described above, since the phase comparison is performed based on the respective voltage levels of the first and second reference clocks instead of based on the timings of the occurrences of edges of the first and second reference clocks, it is possible to suppress an increase in delay time caused by disturbance of the clock waveforms, thereby reducing variations in the difference in delay time between the first and second reference clocks. As a result, the phase state of the first and second reference clocks is less likely to transition to the improper lock state, and thus the stability of the proper lock state in the DLL circuit is increased as compared to the conventional circuit.

The DLL circuit described above preferably further includes an excessive delay state detection circuit for detecting an excessive delay state in which a difference in delay time between the first and second reference clocks is greater than one cycle. And during a time interval in which the excessive delay state detection circuit detects the excessive delay state, the delay control circuit preferably gradually reduces the delay time in the variable delay circuit irrespective of the comparison result obtained by the phase comparison circuit.

In the DLL circuit described above, when the difference in delay time between the first and second reference clocks is excessive, the delay time in the variable delay circuit is forced to be gradually reduced irrespective of the comparison result obtained by the phase comparison circuit. Since this makes the difference in delay time between the first and second reference clocks approach one cycle, the phase state of the first and second reference clocks is less likely to transition to the improper lock state.

The DLL circuit described above preferably further includes an insufficient delay state detection circuit for detecting an insufficient delay state in which a difference in delay time between the first and second reference clocks is smaller than one cycle. And the delay control circuit preferably gradually increases the delay time in the variable delay circuit during a time interval in which the insufficient delay state detection circuit detects the insufficient delay state.

In the DLL circuit described above, when the difference in delay time between the first and second reference clocks is insufficient, the delay time in the variable delay circuit is increased gradually. This makes the difference in delay time between the first and second reference clocks approach one cycle, allowing the phase state of the first and second reference clocks to be stabilized in the proper lock state.

In another aspect of the invention, a DLL circuit includes: a variable delay circuit for successively delaying an input clock to generate a plurality of delayed clocks having different phases; a phase comparison circuit for receiving a first reference clock, which is either one of the delayed clocks or the input clock, and a second reference clock, which is one of the delayed clocks and whose phase lags behind that of the first reference clock, and comparing the phases of the first and second reference clocks; an excessive delay state detection circuit for detecting an excessive delay state in which a difference in delay time between the first and second reference clocks is greater than one cycle; and a delay control circuit for controlling, during a time interval in which the excessive delay state detection circuit does not detect the excessive delay state, a delay time in the variable delay circuit according to a result of the comparison obtained by the phase comparison circuit, and gradually reducing the delay time in the variable delay circuit irrespective of the comparison result obtained by the phase comparison circuit during a time interval in which the excessive delay state detection circuit detects the excessive delay state.

In the DLL circuit described above, when the difference in delay time between the first and second reference clocks is excessive, the delay time in the variable delay circuit is forced to be gradually reduced irrespective of the comparison result obtained by the phase comparison circuit. Since this makes the difference in delay time between the first and second reference clocks approach one cycle, the phase state of the first and second reference clocks is less likely to transition to the improper lock state. Even if the phase state of the first and second reference clocks is the improper lock state, it is possible to make the phase state return to the proper lock state. In this way, the stability of the proper lock state in the DLL circuit is increased as compared to the conventional circuit.

DETAILED DESCRIPTION OF THE INVENTION

Figure 1:
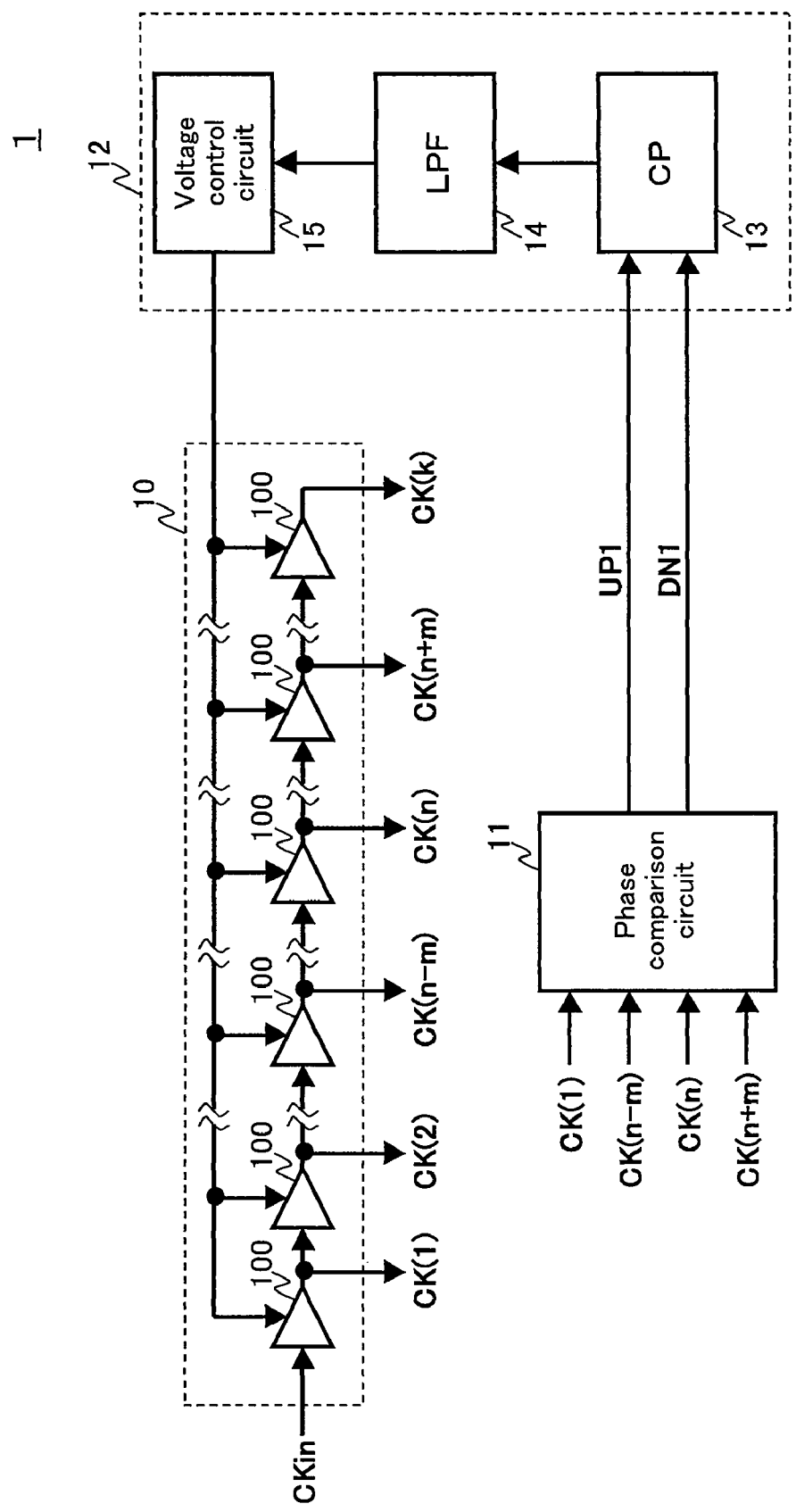
FIG. 1 illustrates the configuration of a DLL circuit according to a first embodiment of the invention.

Hereinafter, the preferred embodiments of the present invention will be described in detail with reference to the accompanying drawings. In the drawings, the same or equivalent components are denoted by the same reference numerals, and description thereof will not be repeated.

First Embodiment

FIG. 1 illustrates the configuration of a DLL circuit according to a first embodiment of the present invention. The DLL circuit 1 includes a variable delay circuit 10, a phase comparison circuit 11, and a delay control circuit 12.

The variable delay circuit 10 includes cascade-connected k delay elements 100, 100, . . . (where k is an integer equal to or greater than 3) and successively delays an input clock CKin to generate k delayed clocks CK(1), CK(2), . . . , CK(k). If it is assumed that a delay time in each of the delay elements 100, 100, . . . is "Tp", the delay times of the delayed clocks CK(1), CK(2), . . . , CK(k) are "Tp×1", "Tp×2" . . . , "Tp×k", respectively.

The phase comparison circuit 11 receives the first delayed clock CK(1) and the n-th delayed clock CK(n) (where $2 \leq n \leq k$) as first and second reference clocks, respectively, performs a phase comparison based on the voltage levels of the delayed clocks CK(1) and CK(n), and outputs a charge signal UP1 or a discharge signal DN1 as the comparison result. The charge signal UP1 is a signal for making a charge pump circuit 13 perform a charge operation and indicates that the delayed clock CK(n) lags behind the delayed clock CK(1). The discharge signal DN1 is a signal for making the charge pump circuit 13 perform a discharge operation and indicates that the delayed clock CK(n) leads the delayed clock CK(1).

The phase comparison circuit 11 also receives the (n−m)th delayed clock CK(n−m) and the (n+m)th delayed clock CK(n+m) as first and second interval specification clocks, respectively, and specifies time intervals between rising edges of the delayed clocks CK(n−m) and CK(n+m) as validated intervals. The rising edges of the delayed clock CK(n) occur during the validated intervals. The phase comparison circuit 11 compares the phases of the delayed clocks CK(1) and CK(n) only during these validated intervals. The width of the validated intervals is preferably smaller than or equal to 0.5 cycle of the delayed clock CK(1). That is, preferably, m≦(n/4).

The delay control circuit 12 includes the charge pump circuit 13, a low-pass filter 14, and a voltage control circuit 15. In response to the charge signal UP1 or the discharge signal DN1 from the phase comparison circuit 11, the charge pump circuit 13 charges or discharges the output voltage of the low-pass filter 14.

The voltage control circuit 15 supplies the output voltage of the low-pass filter 14 to the respective delay controllable terminals of the delay elements 100, 100, .... The lower the output voltage of the low-pass filter 14, the longer the delay times in the delay elements 100, 100, ....

[Phase Comparison Circuit]

Figure 2:
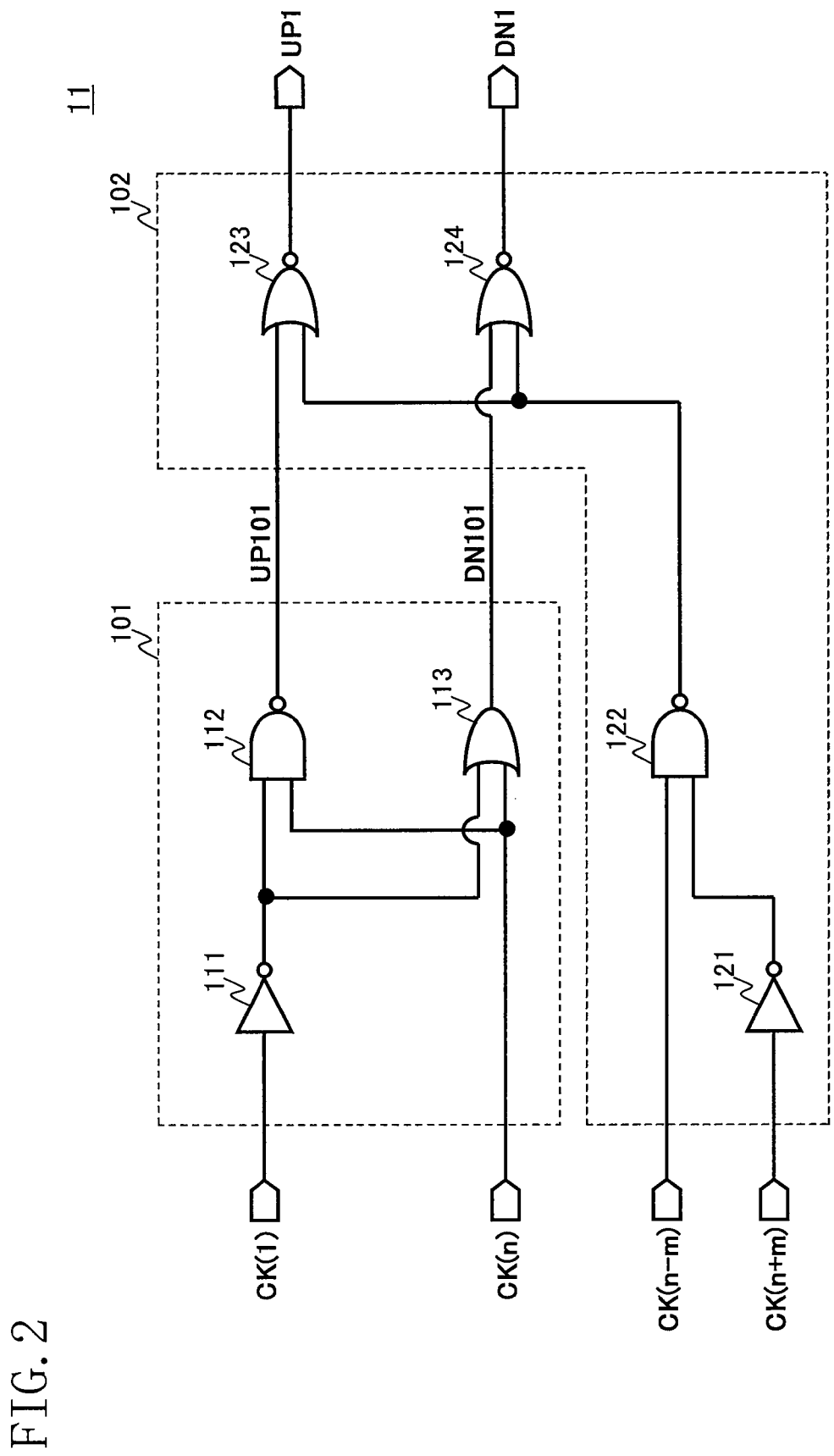
FIG. 2 illustrates an example of the internal configuration of a phase comparison circuit shown in FIG. 1.

FIG. 2 illustrates an example of the internal configuration of the phase comparison circuit 11 shown in FIG. 1. The phase comparison circuit 11 includes a voltage level comparison section 101 and a validated interval specifying section 102.

The voltage level comparison section 101 is composed of, e.g., an inverting element 111, a NAND element 112, and an OR circuit 113. The inverting element 111 receives the delayed clock CK(1). The NAND element 112 and the OR circuit 113 each receive the output of the inverting element 111 and the delayed clock CK(n). When the delayed clock CK(1) is at the active level (at the high level in this embodiment) and the delayed clock CK(n) is at the inactive level (at the low level in this embodiment), the voltage level comparison section 101 puts a determination signal UP101 to the low level. When the delayed clock CK(1) is at the low level and the delayed clock CK(n) is at the high level, the voltage level comparison section 101 puts a determination signal DN101 to the low level.

The validated interval specifying section 102 is composed of, e.g., an inverting element 121, which receives the delayed clock CK(n+m), a NAND element 122, which receives the delayed clock CK(n−m) and the output of the inverting element 121, a NOR element 123, which receives the determination signal UP101 and the output of the NAND element 122, and a NOR element 124, which receives the determination signal DN101 and the output of the NAND element 122. The validated interval specifying section 102 specifies each time interval from a rising edge of the delayed clock CK(n−m) to the next rising edge of the delayed clock CK(n+m) as a validated interval, and outputs the determination signal UP101 or DN101 as the charge signal UP1 or as the discharge signal DN1 only during these validated intervals.

[Operation]

Figure 3:
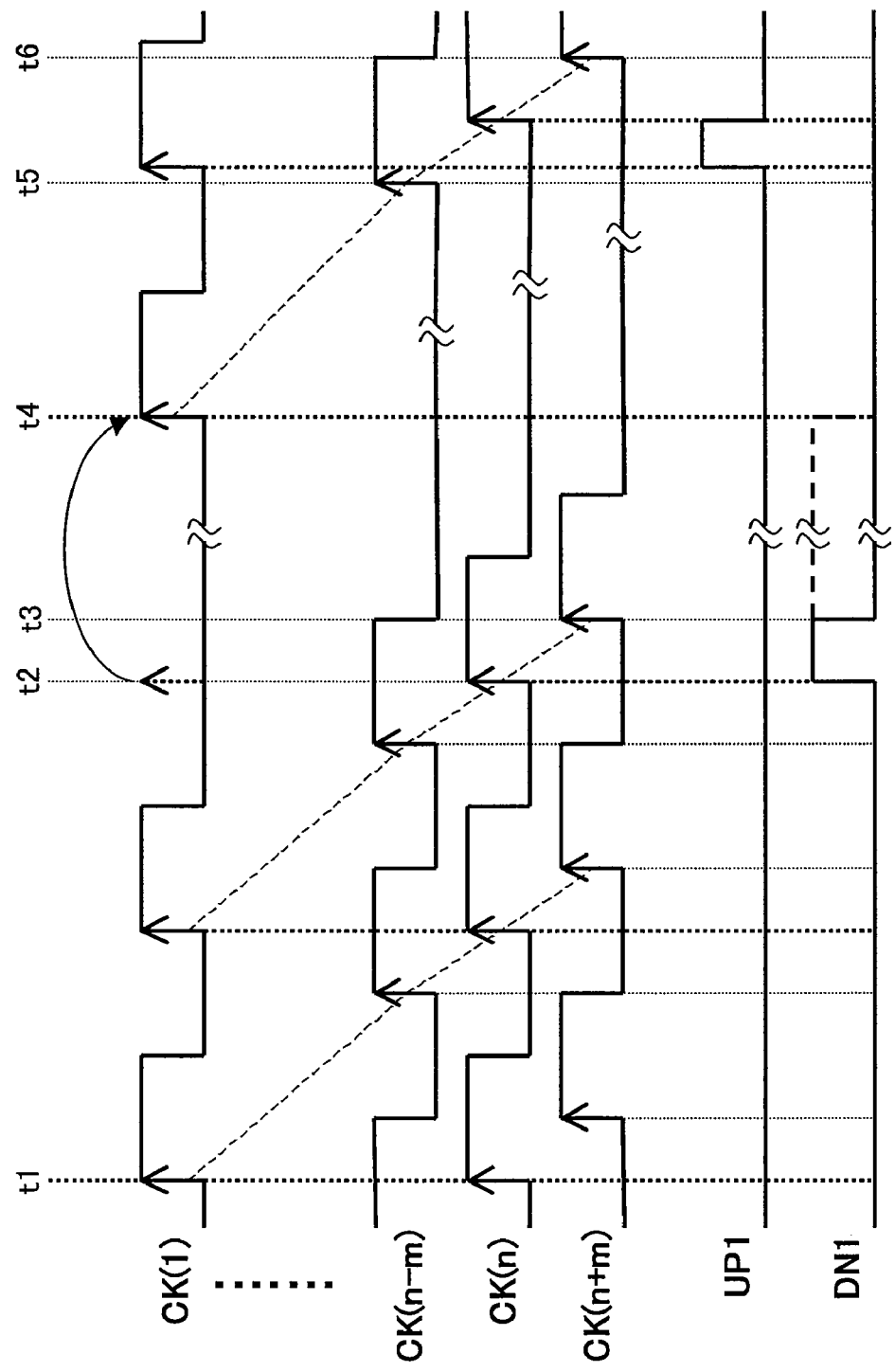
FIG. 3 is a signal waveform diagram for explaining the operation of the DLL circuit shown in FIG. 1.

Next, with reference to FIG. 3, the operation of the DLL circuit 1 shown in FIG. 1 will be described. In this embodiment it is assumed that the clock waveforms are disturbed due to the presence of disturbance noise or due to an interruption of the supply of the input clock CKin, etc., and the rising edge of the delayed clock CK(1) that should occur at a time t2 occurs at a time t4.

During the time interval from the time t1 to the time t2, the phase state of the delayed clocks CK(1) and CK(n) is a "proper lock state". The term "proper lock state" herein means a phase state in which the phases of the delayed clocks CK(1) and CK(n) are locked, and a difference in delay time between the delayed clocks CK(1) and CK(n) is equal to one cycle of the delayed clock CK(1). Since the phases of the delayed clocks CK(1) and CK(n) coincide with each other, the phase comparison circuit 11 outputs neither the charge signal UP1 nor the discharge signal DN1.

At the time t2, the rising edge of the delayed clock CK(1) that should occur does not occur, and only the delayed clock CK(n) transitions from the low level to the high level. Since this transition in voltage level is made during the time interval (i.e., the validated interval) between the rising edges of the delayed clocks CK(n−m) and CK(n+m), the phase comparison circuit 11 outputs the discharge signal DN1.

At a time t3, the rising edge of the delayed clock CK(n+m) occurs. This causes the validated interval to end, and the phase comparison circuit 11 thus stops the output of the discharge signal DN1.

Next, at the time t4, the delayed clock CK(1) transitions from the low level to the high level. However, since the rising edge of the delayed clock CK(n−m) does not occur (i.e., since the validated interval does not start), the phase comparison circuit 11 does not output the charge signal UP1.

Next, during the time interval (i.e., the validated interval) from a time t5 to a time t6, since the delayed clock CK(1) transitions from the low level to the high level and then the delayed clock CK(n) transitions from the low level to the high level, the phase comparison circuit 11 outputs the charge signal UP1. In response to this charge signal UP1, the delay control circuit 12 reduces the delay time in the variable delay circuit 10. In this manner, the difference in delay time between the delayed clocks CK(1) and CK(n) is adjusted, and the phase state of the delayed clocks CK(1) and CK(n) returns to the proper lock state.

In the case of conventional phase comparisons based on the timings of the occurrences of edges (for example, in the frequency phase comparison circuit 91), the discharge signal DN1 would continue to be output during the time interval between the time t2 and the time t4. On the other hand, in the DLL circuit 1 of this embodiment, since the validated interval is terminated at the time t3, the time interval during which the discharge signal DN1 is output is shortened.

As described above, by performing the phase comparisons based on the respective voltage levels of the delayed clocks CK(1) and CK(n) instead of based on the timings of the occurrences of the edges of the delayed clocks CK(1) and CK(n), it is possible to suppress the excessive output of the discharge signal DN1 caused by the disturbance of the clock waveforms, thereby enabling variations in the delay time difference to be reduced. This makes the phase state of the delayed clocks CK(1) and CK(n) less likely to transition to an "improper lock state", and hence the stability of the proper lock state in the DLL circuit is increased as compared to the conventional circuit. The term "improper lock state" herein means a phase state in which the phases of the delayed clocks CK(1) and CK(n) are locked, but the difference in delay time between the delayed clocks CK(1) and CK(n) is not equal to one cycle of the delayed clock CK(1), for example, a phase state in which the difference in delay time between the delayed clocks CK(1) and CK(n) is equal to an integral number of cycles greater than 1 (such as two cycles, three cycles, ...).

The first reference clock supplied to the phase comparison circuit 11 may be the input clock CKin or a delayed clock that is different from the delayed clock CK(1). The second reference clock supplied to the phase comparison circuit 11 may be any one of the delayed clocks CK(1), ..., CK(k) whose phase lags behind the phase of the first reference clock.

The amount of phase lead of the first interval specification clock with respect to the second reference clock may differ from the amount of phase lag of the second interval specification clock with respect to the second reference clock. That is, the first and second interval specification clocks may be the (n−x)th delayed clock and the (n+y)th delayed clock, respectively (where x≠y).

Second Embodiment

Figure 4:
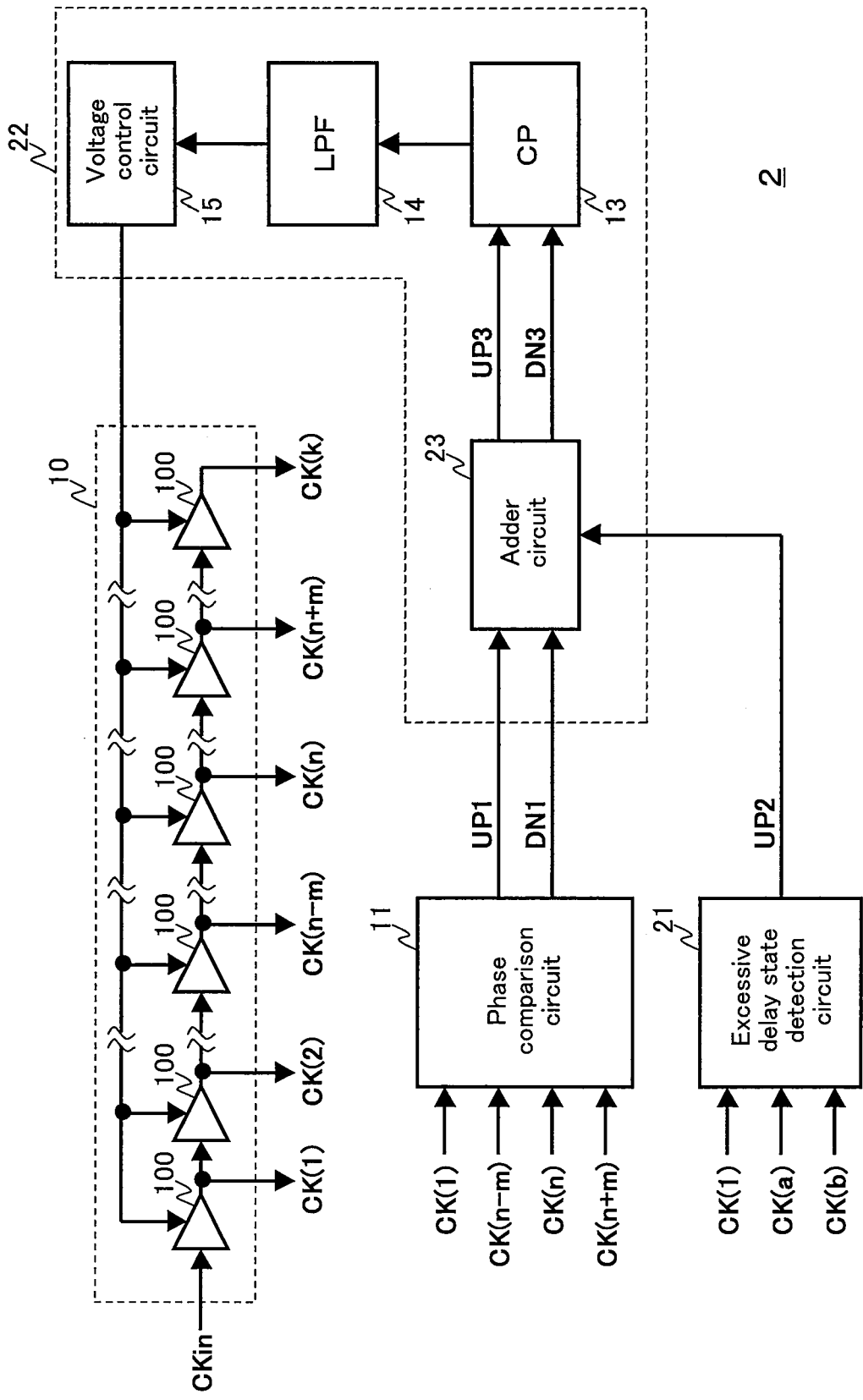
FIG. 4 illustrates the configuration of a DLL circuit according to a second embodiment of the invention.
Figure 8:
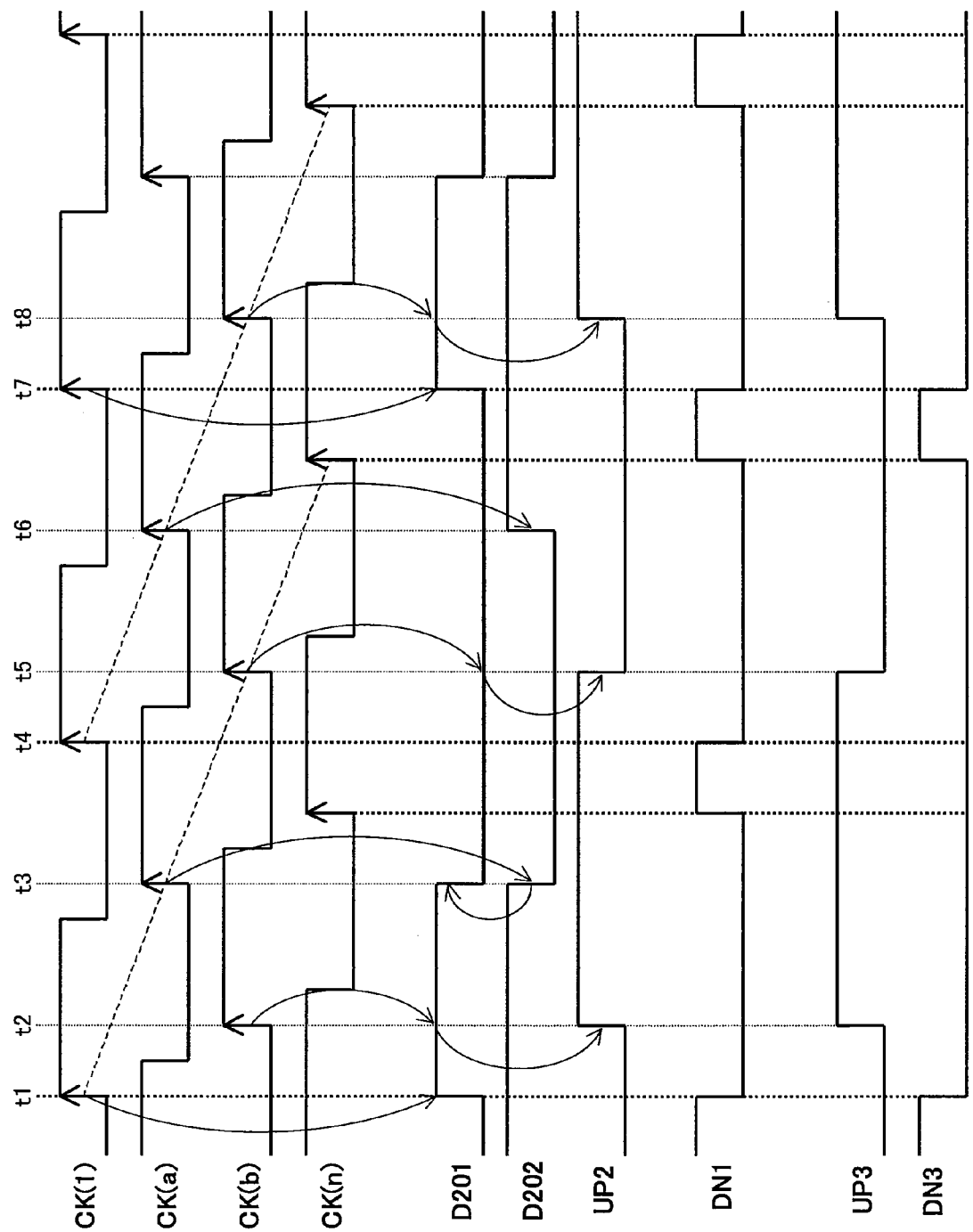
FIG. 8 is a signal waveform diagram for explaining the operation of the DLL circuit shown in FIG. 4 performed when the difference in delay time is greater than one cycle.

FIG. 4 illustrates the configuration of a DLL circuit according to a second embodiment of the present invention. The DLL circuit 2 includes the variable delay circuit 10 and the phase comparison circuit 11 shown in FIG. 1, and an excessive delay state detection circuit 21 and a delay control circuit 22. The term "excessive delay state" herein means a predetermined phase state in which a difference in delay time between delayed clocks CK(1) and CK(n) is greater than one cycle of the delayed clock CK(1), for example, a phase state such as shown in FIG. 8. Also, in the excessive delay state, if the phases of the delayed clocks CK(1) and CK(n) are locked, then such a phase state is herein called an improper lock state.

[Excessive Delay State Detection Circuit]

The excessive delay state detection circuit 21 receives the first delayed clock CK(1), the a-th delayed clock CK(a), and the b-th delayed clock CK(b) as a first reference clock, a first excess detection clock, and a second excess detection clock, respectively, and upon detection that the phase state of the delayed clocks CK(1) and CK(n) is the excessive delay state, the excessive delay state detection circuit 21 outputs a forced charge signal UP2 as the detection result.

Now, a description will be made of the delayed clocks CK(a) and CK(b). When the difference in delay time between the delayed clocks CK(1) and CK(n) has transitioned from a phase state in which the delay time difference is equal to one cycle of the delayed clock CK(1) (for example, the proper lock state) to the excessive delay state, the relation in terms of the temporal order between the timings of the occurrences of the rising edges of the delayed clocks CK(a) and CK(b) is reversed. For example, in the proper lock state, the rising edges of the delayed clocks CK(1), CK(a) and CK(b) occur in the order of CK(1), CK(a) and CK(b), whereas, in the excessive delay state, the rising edges of the delayed clocks CK(1), CK(a) and CK(b) occur in the order of CK(1), CK(b) and CK(a). In this embodiment, it is assumed that 1<a<b<n.

The excessive delay state detection circuit 21 compares the timings of the occurrences of rising edges of the delayed clocks CK(a) and CK(b) with respect to rising edges of the delayed clock CK(1), and upon detection that the relation in terms of the temporal order between the timings of the occurrences of the rising edges of the delayed clocks CK(a) and CK(b) has been reversed, the excessive delay state detection circuit 21 outputs the forced charge signal UP2.

Figure 5:
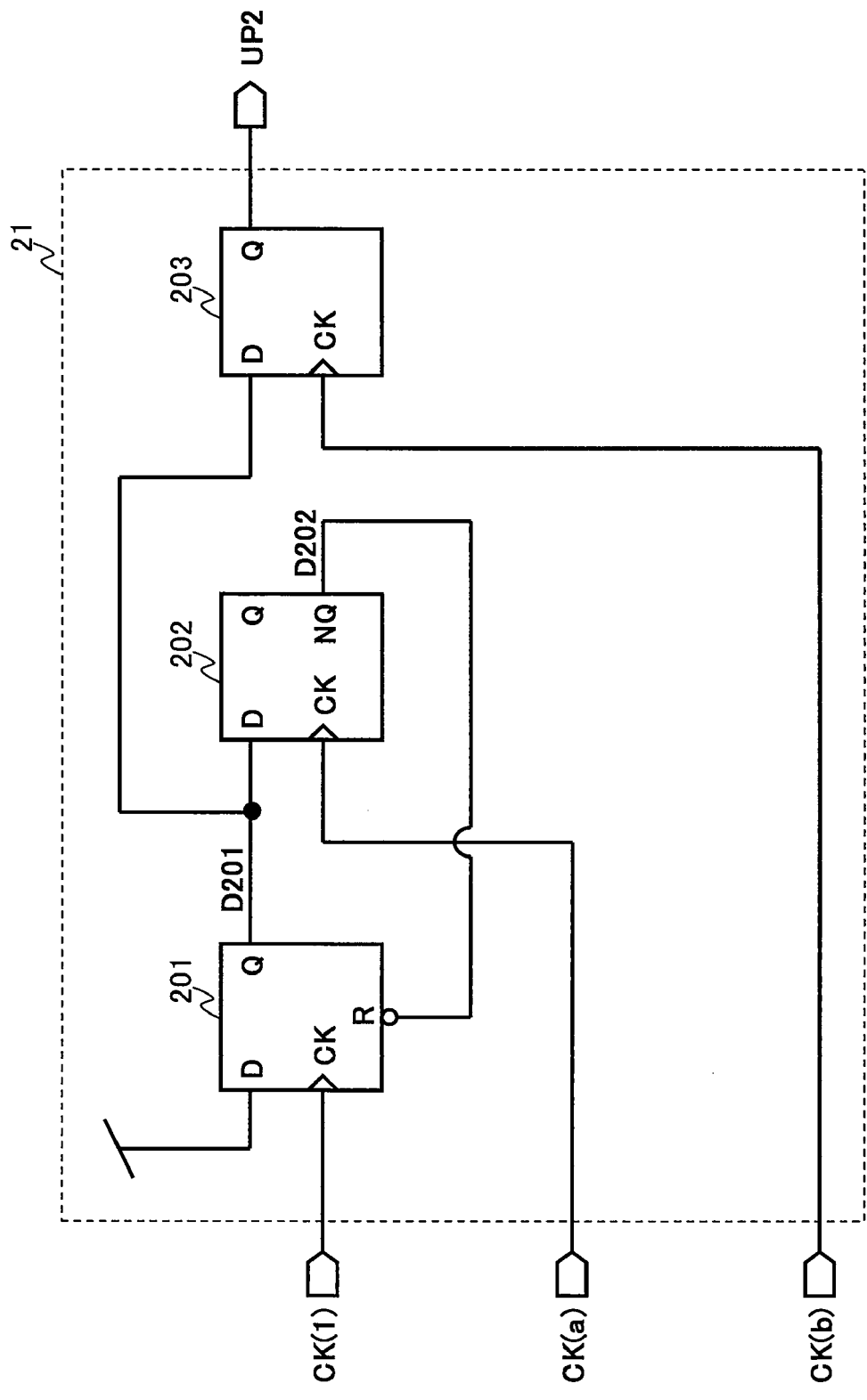
FIG. 5 illustrates an example of the internal configuration of an excessive delay state detection circuit shown in FIG. 4.

As shown in FIG. 5, the excessive delay state detection circuit 21 is composed of flip-flops 201, 202, and 203, for example. The flip-flop 201 latches power supply voltage in synchronization with the rising edges of the delayed clock CK(1). The flip-flop 202 latches the output (an output signal D201) of the flip-flop 201 in synchronization with the rising edges of the delayed clock CK(a). When the inverted output (a reset signal D202) of the flip-flop 202 goes to the low level, the flip-flop 201 is reset, and the output signal D201 goes to the low level. The flip-flop 203 latches the output signal D201 in synchronization with the rising edges of the delayed clock CK(b). The output of the flip-flop 203 is output as the forced charge signal UP2.

[Delay Control Circuit]

During the time intervals in which the excessive delay state detection circuit 21 outputs the forced charge signal UP2, the delay control circuit 22 gradually reduces the delay time in the variable delay circuit 10 irrespective of the comparison result obtained by the phase comparison circuit 11. During the time intervals in which the excessive delay state detection circuit 21 does not output the forced charge signal UP2, the delay control circuit 22 controls the delay time in the variable delay circuit 10 according to the comparison result obtained by the phase comparison circuit 11. The delay control circuit 22 includes the charge pump circuit 13, the low-pass filter 14, and the voltage control circuit 15 shown in FIG. 1, and an adder circuit 23.

Figure 6:
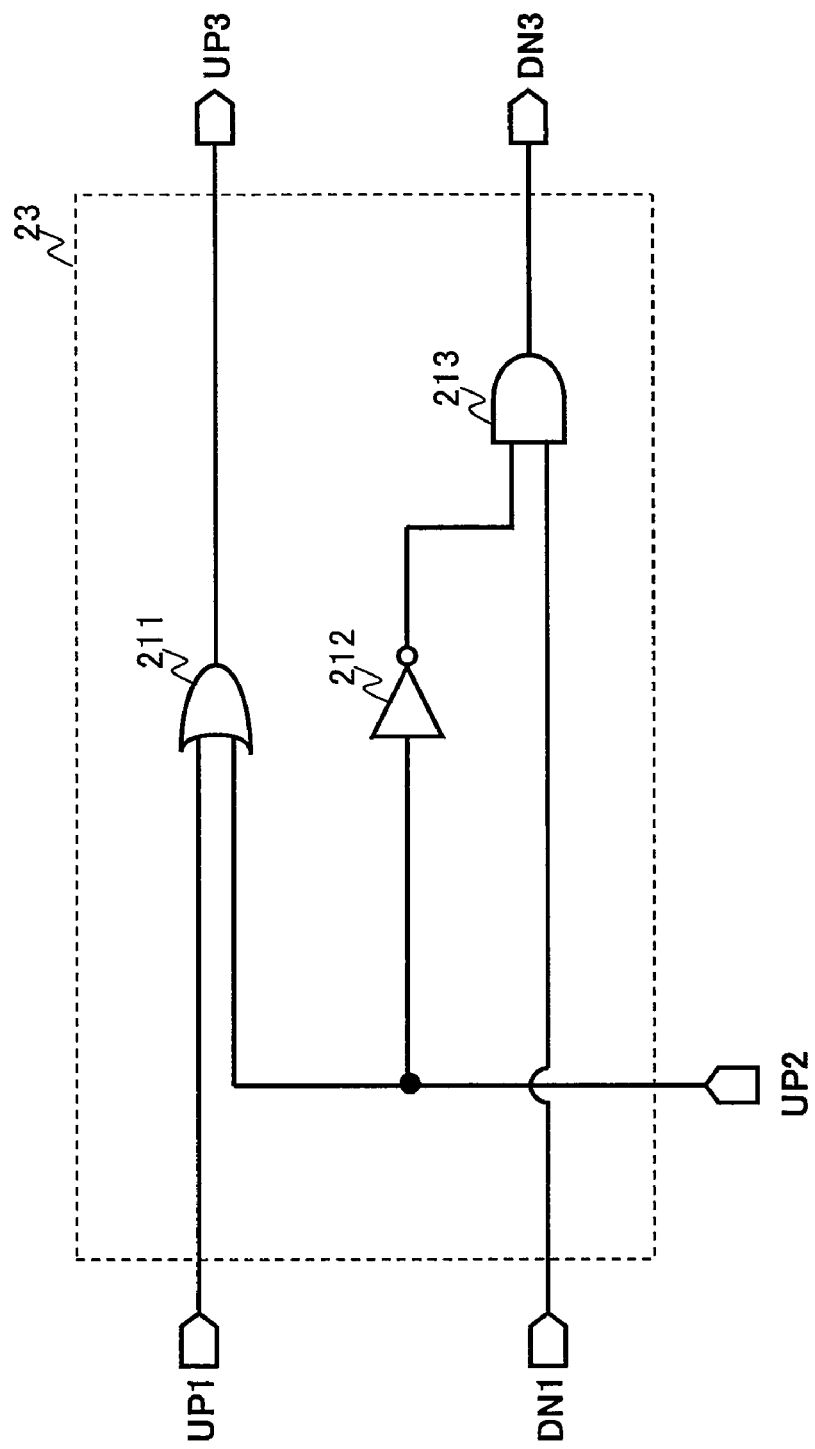
FIG. 6 illustrates an example of the internal configuration of an adder circuit shown in FIG. 4.

As shown in FIG. 6, the adder circuit 23 is composed of, e.g., an OR element 211, an inverting element 212, and an AND element 213. When at least either the charge signal UP1 or the forced charge signal UP2 is at the high level, the OR element 211 puts a charge signal UP3 to the high level. The inverting element 212 inverts the forced charge signal UP2. When the output of the inverting element 212 and the discharge signal DN1 are both at the high level, the AND element 213 puts a discharge signal DN3 to the high level.

In cases in which the forced charge signal UP2 is output, the adder circuit 23 only outputs the charge signal UP3 irrespective of the comparison result (the charge signal UP1 or the discharge signal DN1) obtained by the phase comparison circuit 11. This causes the charge pump circuit 13 to perform a charge operation during the time intervals in which the forced charge signal UP2 is output, so that the delay time in the variable delay circuit 10 is reduced gradually.

On the other hand, in cases in which the forced charge signal UP2 is not output, the adder circuit 23 supplies the charge signal UP1 or the discharge signal DN1 from the phase comparison circuit 11 to the charge pump circuit 13 as the charge signal UP3 or as the discharge signal DN3.

[Operation]

Next, with reference to FIGS. 7 and 8, the operation of the DLL circuit shown in FIG. 4 will be described. In the following descriptions, for the sake of simplicity, it is assumed that phase comparisons between the delayed clocks CK(1) and CK(n) are all performed during validated intervals.

Figure 7:
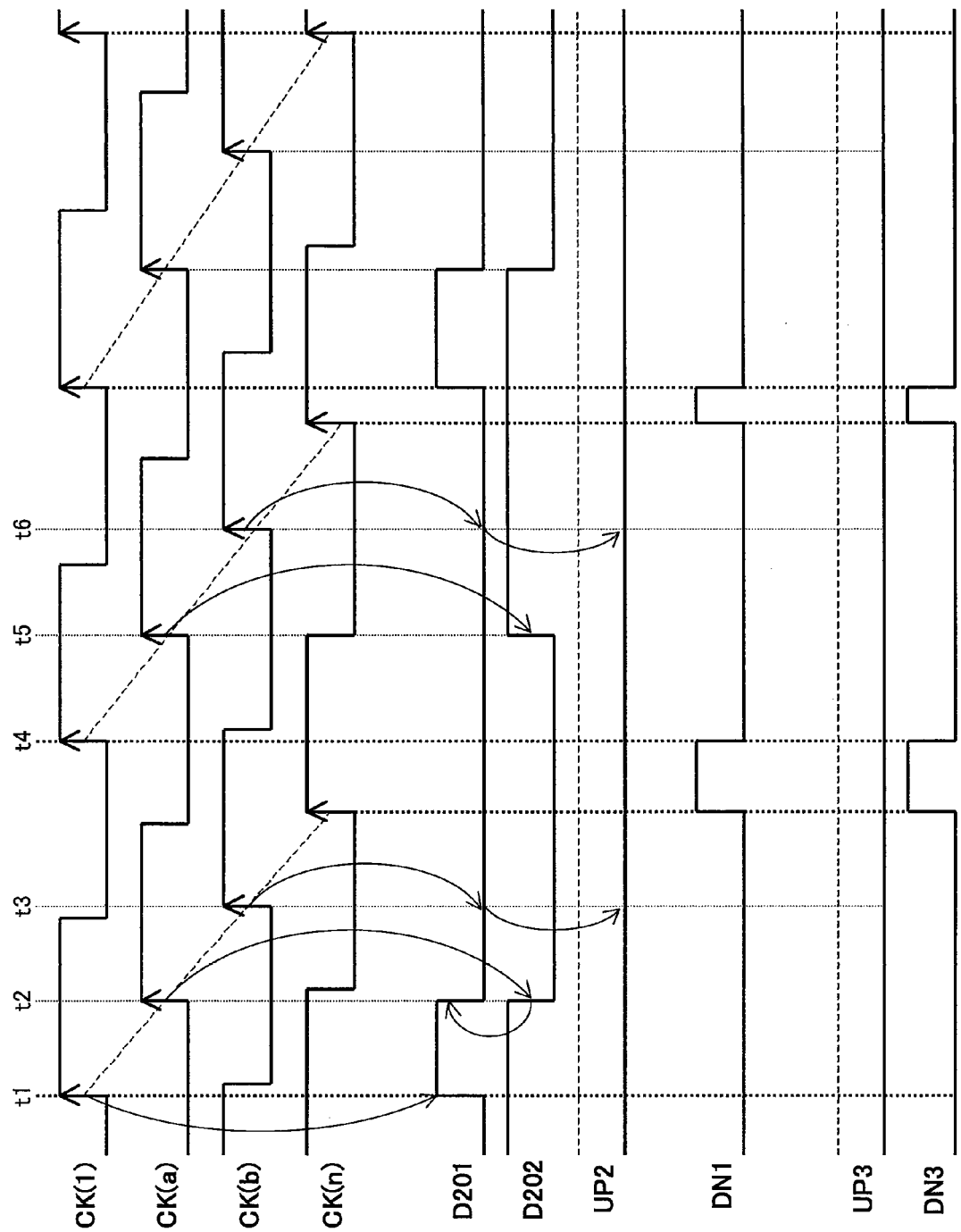
FIG. 7 is a signal waveform diagram for explaining the operation of the DLL circuit shown in FIG. 4 performed when a difference in delay time is smaller than one cycle.

FIG. 7 shows a phase state in which the difference in delay time between the delayed clocks CK(1) and CK(n) is smaller than one cycle of the delayed clock CK(1). In this state, the rising edges of the delayed clock CK(b) occur later than the rising edges of the delayed clock CK(a) with respect to the rising edges of the delayed clock CK(1).

At a time t1, the flip-flop 201 latches power supply voltage in synchronization with the rising edge of the delayed clock CK(1). This causes the output signal D201 (the output of the flip-flop 201) to transition from the low level to the high level.

At a time t2, the flip-flop 202 latches the output signal D201 in synchronization with the rising edge of the delayed clock CK(a). This causes the reset signal D202 (the inverted output of the flip-flop 202) to transition from the high level to the low level, so that the flip-flop 201 is reset, and the output signal D201 (the output of the flip-flop 201) transitions from the high level to the low level.

At a time t3, the flip-flop 203 latches the output signal D201 in synchronization with the rising edge of the delayed clock CK(b). Since the output signal D201 is at the low level, the forced charge signal UP2 (the output of the flip-flop 203) is maintained at the low level.

Next, at a time t4, although the rising edge of the delayed clock CK(1) occurs, the output signal D201 is maintained at the low level because the flip-flop 201 is in the reset state.

At a time t5, the flip-flop 202 latches the output signal D201 in synchronization with the rising edge of the delayed clock CK(a). This causes the reset signal D202 to transition from the low level to the high level, thereby terminating the reset state of the flip-flop 201.

At a time t6, the flip-flop 203 latches the output signal D201 in synchronization with the rising edge of the delayed clock CK(b). Since the output signal D201 is at the low level, the forced charge signal UP2 (the output of the flip-flop 203) is maintained at the low level.

In this manner, when the difference in delay time between the delayed clocks CK(1) and CK(n) is smaller than or equal to one cycle of the delayed clock CK(1), the forced charge signal UP2 is not output (that is, the excessive delay state is not detected), and thus the discharge signal DN1 from the phase comparison circuit 11 is supplied to the charge pump circuit 13 as the discharge signal DN3.

FIG. 8 shows a phase state in which the difference in delay time between the delayed clocks CK(1) and CK(n) is greater than one cycle of the delayed clock CK(1). In this state, the rising edges of the delayed clock CK(b) occur earlier than the rising edges of the delayed clock CK(a) with respect to the rising edges of the delayed clock CK(1).

At a time t1, the rising edge of the delayed clock CK(1) occurs, and the output signal D201 transitions from the low level to the high level.

Next, at a time t2, the rising edge of the delayed clock CK(b) occurs earlier than the rising edge of the delayed clock CK(a). Thus, the flip-flop 203 latches the high-level output signal D201 before the flip-flop 201 is reset, and hence the forced charge signal UP2 transitions from the low level to the high level.

Then, at a time t3, the rising edge of the delayed clock CK(a) occurs, the reset signal D202 (the inverted output of the flip-flop 202) transitions from the high level to the low level, and the flip-flop 201 is reset.

At a time t4, although the rising edge of the delayed clock CK(1) occurs, the output signal D201 is maintained at the low level because the flip-flop 201 is in the reset state.

At a time t5, since the flip-flop 203 latches the low-level output signal D201 in synchronization with the rising edge of the delayed clock CK(b), the forced charge signal UP2 transitions from the high level to the low level.

At a time t6, the rising edge of the delayed clock CK(a) occurs, the reset signal D202 transitions from the low level to the high level, and the reset state of the flip-flop 201 is terminated.

At times t7 and t8, the same processing as that performed at the times t1 and t2 is performed, and the forced charge signal UP2 transitions again from the low level to the high level.

In this manner, when the difference in delay time between the delayed clocks CK(1) and CK(n) is greater than one cycle of the delayed clock CK(1), the forced charge signal UP2 is output intermittently. The discharge signal DN1 from the phase comparison circuit 11 is not supplied to the charge pump circuit 13 during the time intervals in which the forced charge signal UP2 is output.

As described above, when the difference in delay time between the delayed clocks CK(1) and CK(n) is excessive, the delay time in the variable delay circuit 10 is forced to be gradually reduced irrespective of the comparison result obtained by the phase comparison circuit 11. Since this makes the difference in delay time between the delayed clocks CK(1) and CK(n) approach one cycle, the phase state of the delayed clocks CK(1) and CK(n) less likely to transition to the improper lock state. Even if the phase state of the delayed clocks CK(1) and CK(n) is the improper lock state, it is possible to make the phase state return to the proper lock state. In this way, the stability of the proper lock state in the DLL circuit is increased as compared to the conventional circuit.

In particular, the intermittent output of the forced charge signal UP2 suppresses an excessive reduction in the delay time in the variable delay circuit 10. It should be noted that even if the forced charge signal UP2 is not output intermittently, it is possible to make the difference in delay time between the delayed clocks CK(1) and CK(n) approach one cycle.

Also, unlike in the conventional circuit (in Patent Document 1), the delay time in the variable delay circuit 10 is not set to a minimum but is reduced gradually. Thus, the time (the recovery time) required for stabilizing the phase state of the delayed clocks CK(1) and CK(n) in the proper lock state is shortened.

Figure 16:
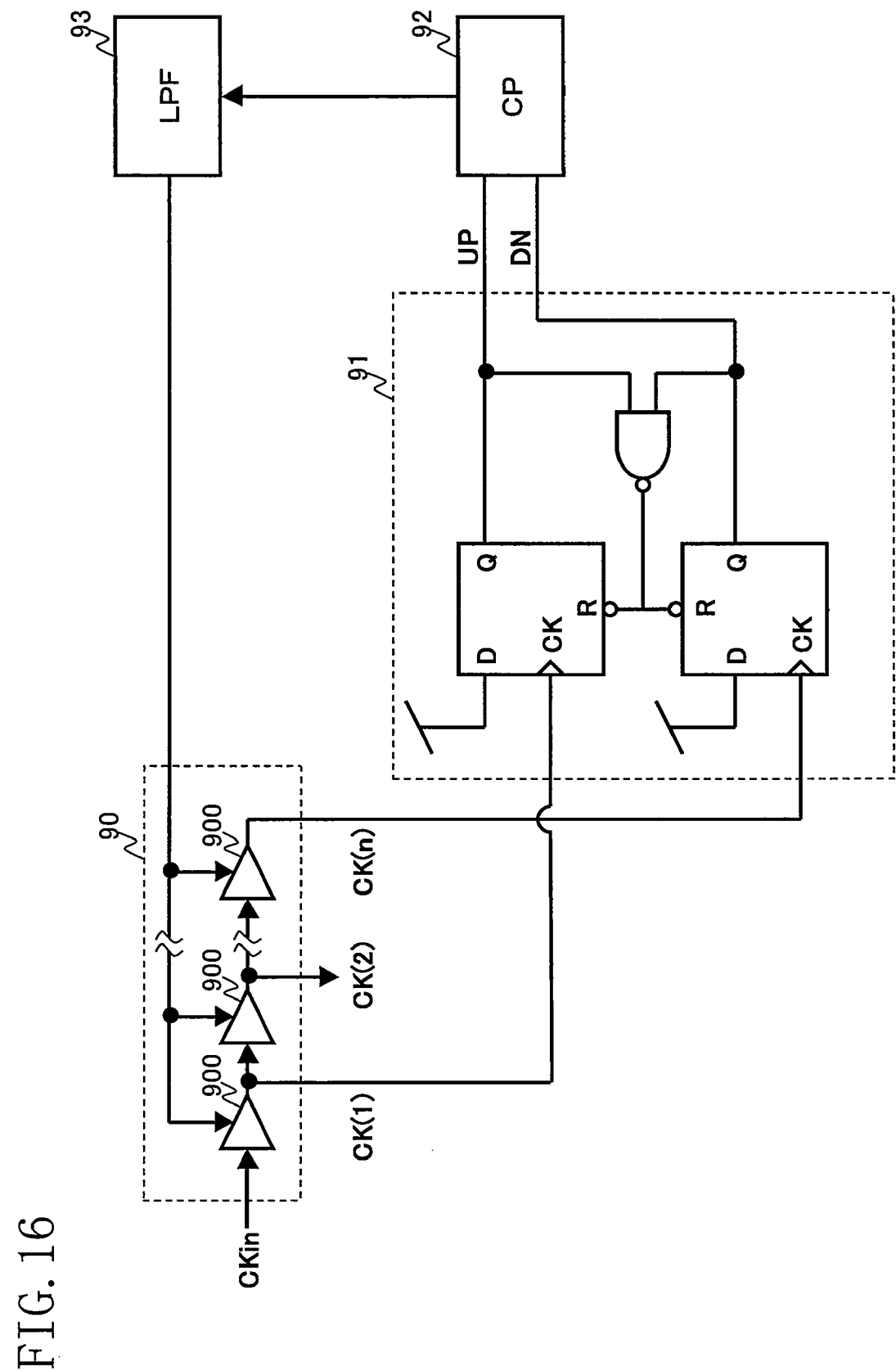
FIG. 16 illustrates the configuration of a conventional DLL circuit.
Figure 17:
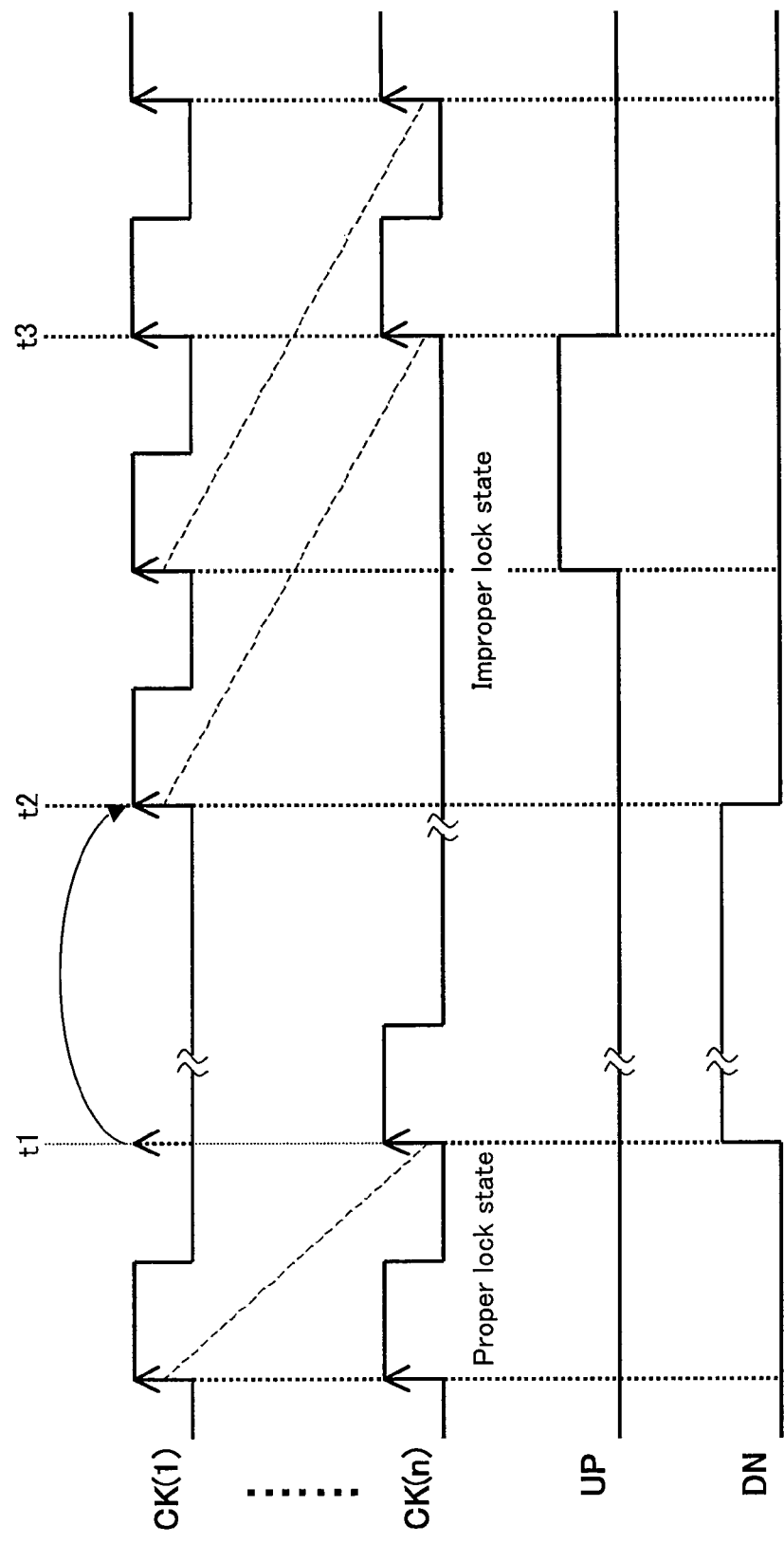
FIG. 17 is a signal waveform diagram for explaining the operation of the DLL circuit shown in FIG. 16.

The DLL circuit 2 shown in FIG. 4 may include, instead of the phase comparison circuit 11, a phase comparison circuit (for example, the frequency phase comparison circuit 91 shown in FIG. 16) which performs phase comparisons based on the timings of the occurrences of edges.

[When Phase Adjustment is Started]

When phase adjustment is started, the voltage control circuit 15 sets the delay time in the variable delay circuit 10 to a minimum. As in this case, when the difference in delay time between the delayed clocks CK(1) and CK(n) is relatively small, the rising edges of the delayed clock CK(n) occur during the time intervals in which the delayed clock CK(1) is at the high level. In this situation, the phase comparison circuit 11 outputs the charge signal UP1 although it is necessary to increase the difference in delay time between the delayed clocks CK(1) and CK(n). Therefore, some measures must be taken to increase the delay time in the variable delay circuit 10.

Figure 9:
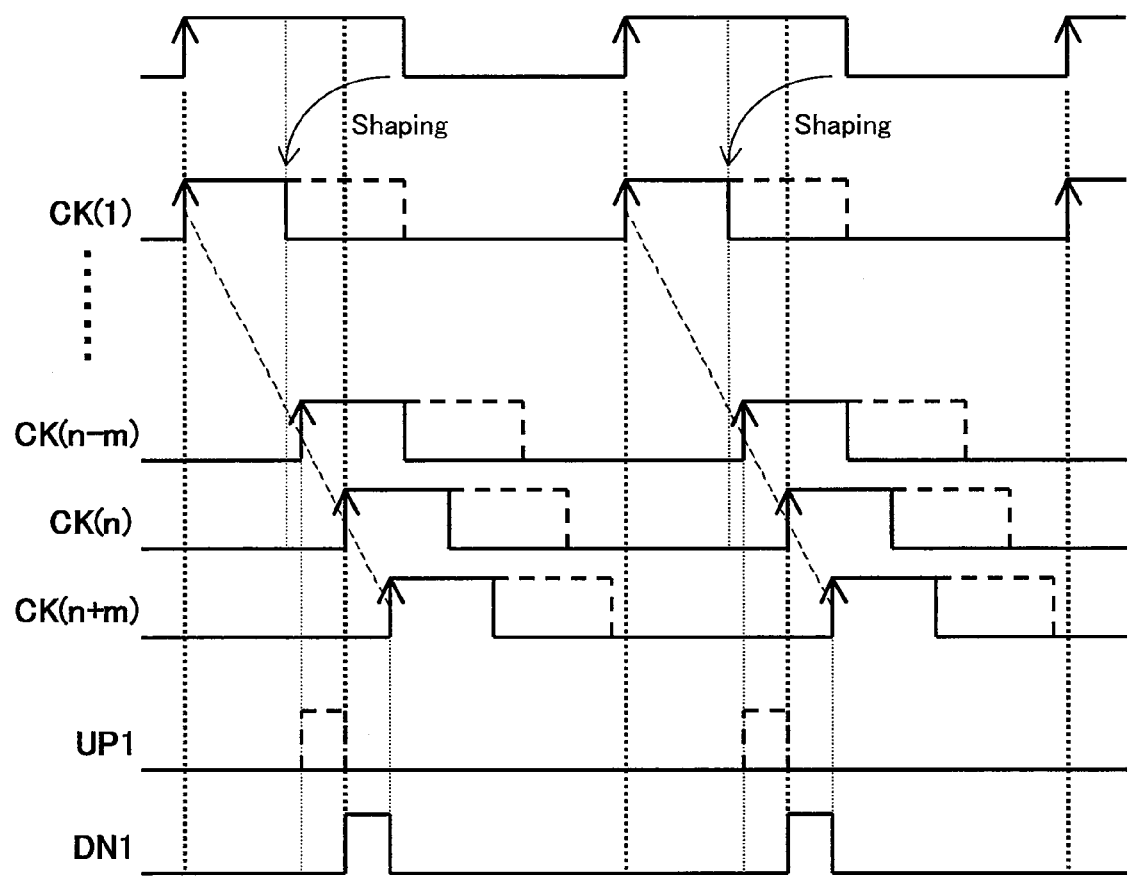
FIG. 9 is a signal waveform diagram for explaining clock waveform shaping performed when phase adjustments are started.

For example, as shown in FIG. 9, a waveform shaping circuit is provided which shapes the waveform of the input clock CKin in such a manner that each falling edge of the delayed clock CK(1) occurs at a time other than during the validated interval before the next rising edge of the delayed clock CK(n) occurs, and the input clock CKin shaped by the waveform shaping circuit is supplied to the variable delay circuit 10. This makes the phase comparison circuit 11 output the discharge signal DN1, thereby enabling the delay time in the variable delay circuit 10 to be increased. Alternatively, the DLL circuit may be configured in the following manner.

Third Embodiment

Figure 10:
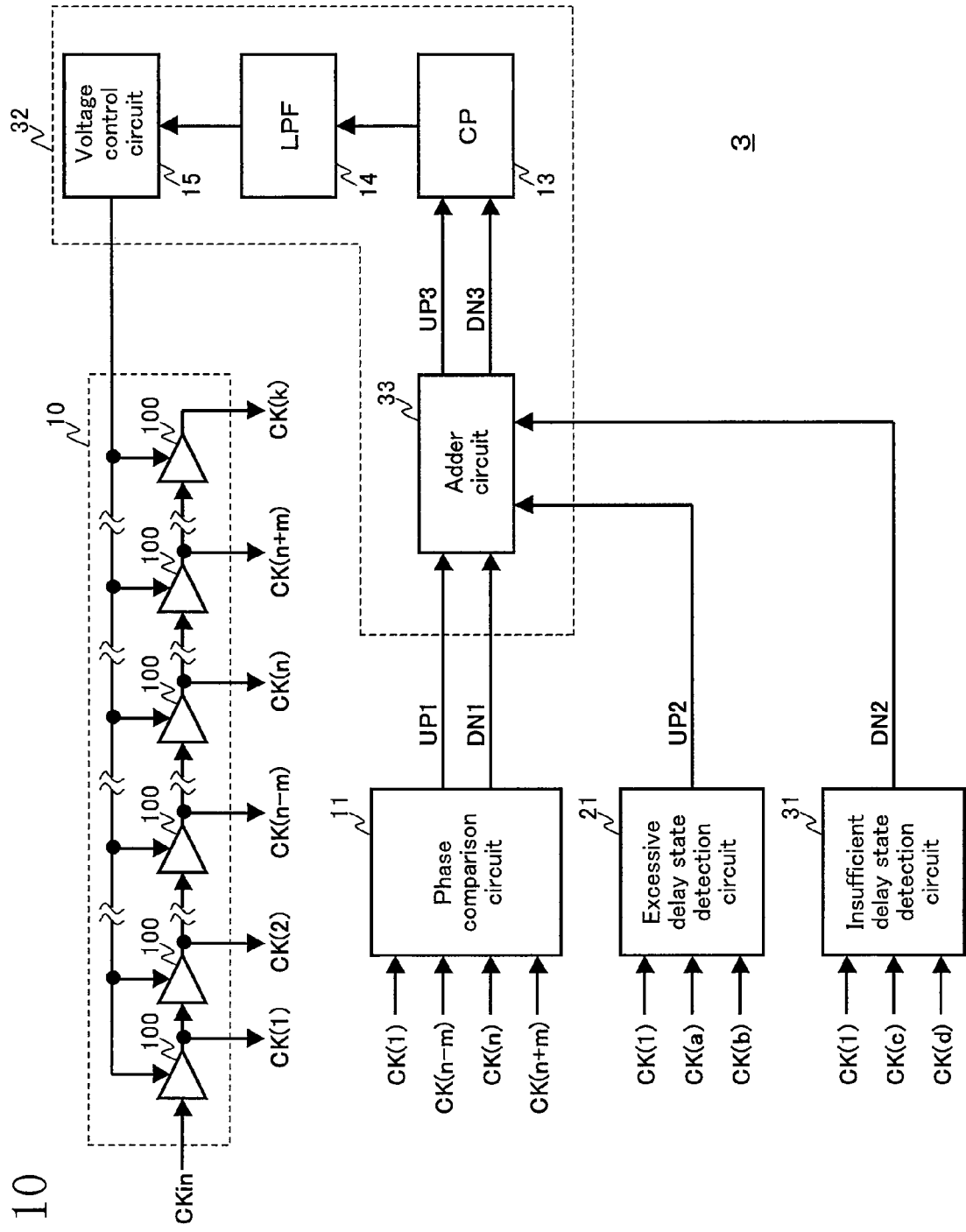
FIG. 10 illustrates the configuration of a DLL circuit according to a third embodiment of the invention.

FIG. 10 illustrates the configuration of a DLL circuit according to a third embodiment of the present invention. The DLL circuit 3 includes the variable delay circuit 10, the phase comparison circuit 11, and the excessive delay state detection circuit 21 shown in FIG. 4, and an insufficient delay state detection circuit 31 and a delay control circuit 32. In this embodiment, the term "insufficient delay state" means a predetermined phase state in which a difference in delay time between delayed clocks CK(1) and CK(n) is smaller than one cycle of the delayed clock CK(1), for example, a phase state shown from a time t1 to a time t4 in FIG. 13.

[Insufficient Delay State Detection Circuit]

The insufficient delay state detection circuit 31 receives the first delayed clock CK(1), the c-th delayed clock CK(c), and the d-th delayed clock CK(d) as a first reference clock, an auxiliary clock, and an insufficiency detection clock, respectively, and upon detection that the phase state of the delayed clocks CK(1) and CK(n) is the insufficient delay state, the insufficient delay state detection circuit 31 outputs a discharge signal DN2.

Now, a description will be made of the delayed clocks CK(c) and CK(d). The phase of the delayed clock CK(c) lags behind that of the delayed clock CK(1) but leads that of the delayed clock CK(d). When the difference in delay time between the delayed clocks CK(1) and CK(n) is equal to one cycle of the delayed clock CK(1), the rising edges of the insufficiency detection clock CK(d) occur during the time intervals in which the delayed clock CK(1) is inactive (i.e., in this embodiment, during the time intervals in which the delayed clock CK(1) is at the low level). In the insufficient delay state, the rising edges of the insufficiency detection clock CK(d) occur during the time intervals in which the delayed clock CK(1) is active (i.e., in this embodiment, during the time intervals in which the delayed clock CK(1) is at the high level). In this embodiment, it is assumed that 1<c<d, and (n/2)<d<n.

Upon detection that a rising edge of the delayed clock CK(d) occurs during a time interval in which the delayed clock CK(1) is at the high level, the insufficient delay state detection circuit 31 outputs the discharge signal DN2.

Figure 11:
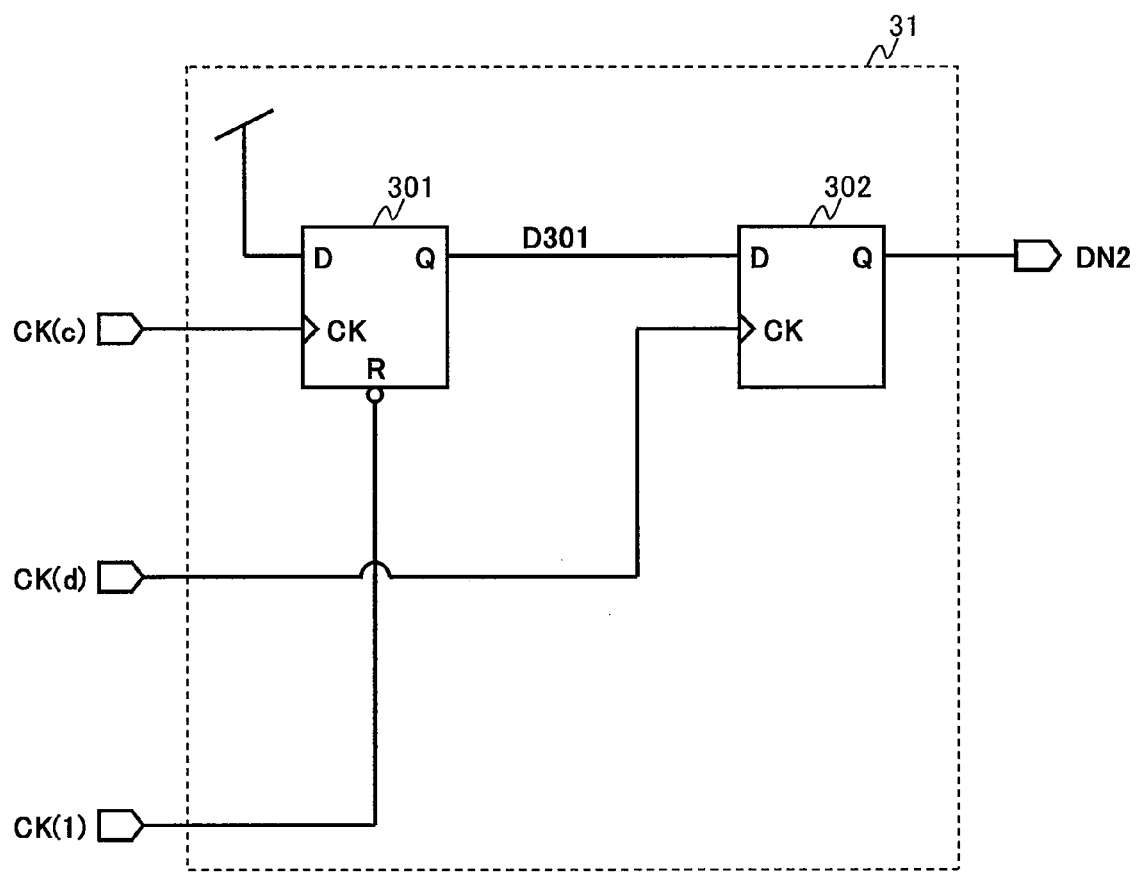
FIG. 11 illustrates an example of the internal configuration of an insufficient delay state detection circuit shown in FIG. 10.

As shown in FIG. 11, the insufficient delay state detection circuit 31 is composed of flip-flops 301 and 302, for example. The flip-flop 301 latches power supply voltage in synchronization with the rising edges of the delayed clock CK(c). When the delayed clock CK(1) goes to the low level, the flip flop 301 is reset, and the output (an intermediate signal D301) of the flip flop 301 goes to the low level. The flip-flop 302 latches the intermediate signal D301 in synchronization with the rising edges of the delayed clock CK(d). The output of the flip flop 302 is output as the discharge signal DN2.

[Delay Control Circuit]

During the time intervals in which the insufficient delay state detection circuit 31 detects the insufficient delay state, the delay control circuit 32 gradually increases the delay time in the variable delay circuit 10. The delay control circuit 32 includes an adder circuit 33 in place of the adder circuit 23 shown in FIG. 4. In the other respects, the configuration of the delay control circuit 32 is the same as that shown in FIG. 4.

Figure 12:
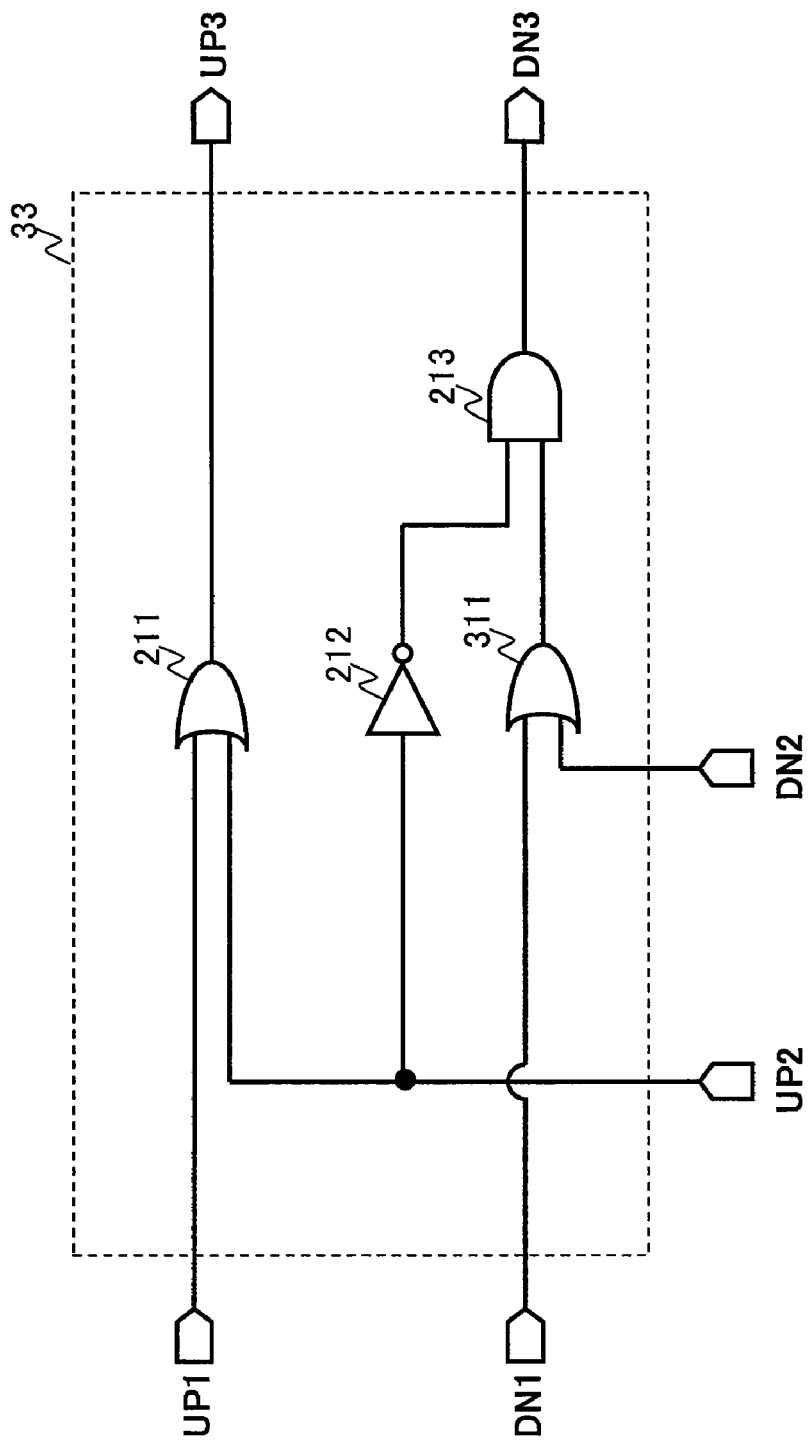
FIG. 12 illustrates an example of the internal configuration of an adder circuit shown in FIG. 10.

As shown in FIG. 12, the adder circuit 33 is composed of, e.g., the OR element 211, the inverting element 212, and the AND element 213 shown in FIG. 6, and an OR element 311 which puts the output thereof to the high level if at least either the discharge signal DN1 or DN2 is at the high level.

In cases in which a forced charge signal UP2 is output, the adder circuit 33 only puts a charge signal UP3 to the high level, irrespective of the comparison result (i.e., the charge signal UP1 or the discharge signal DN1) obtained by the phase comparison circuit 11 and the detection result (i.e., the discharge signal DN2) obtained by the insufficient delay state detection circuit 31.

On the other hand, in cases in which the forced charge signal UP2 is not output, the adder circuit 33 outputs the charge signal UP1 from the phase comparison circuit 11 as the charge signal UP3, and if at least either the discharge signal DN1 or DN2 is output, then the adder circuit 33 puts the discharge signal DN3 to the high level.

[Operation]

Figure 13:
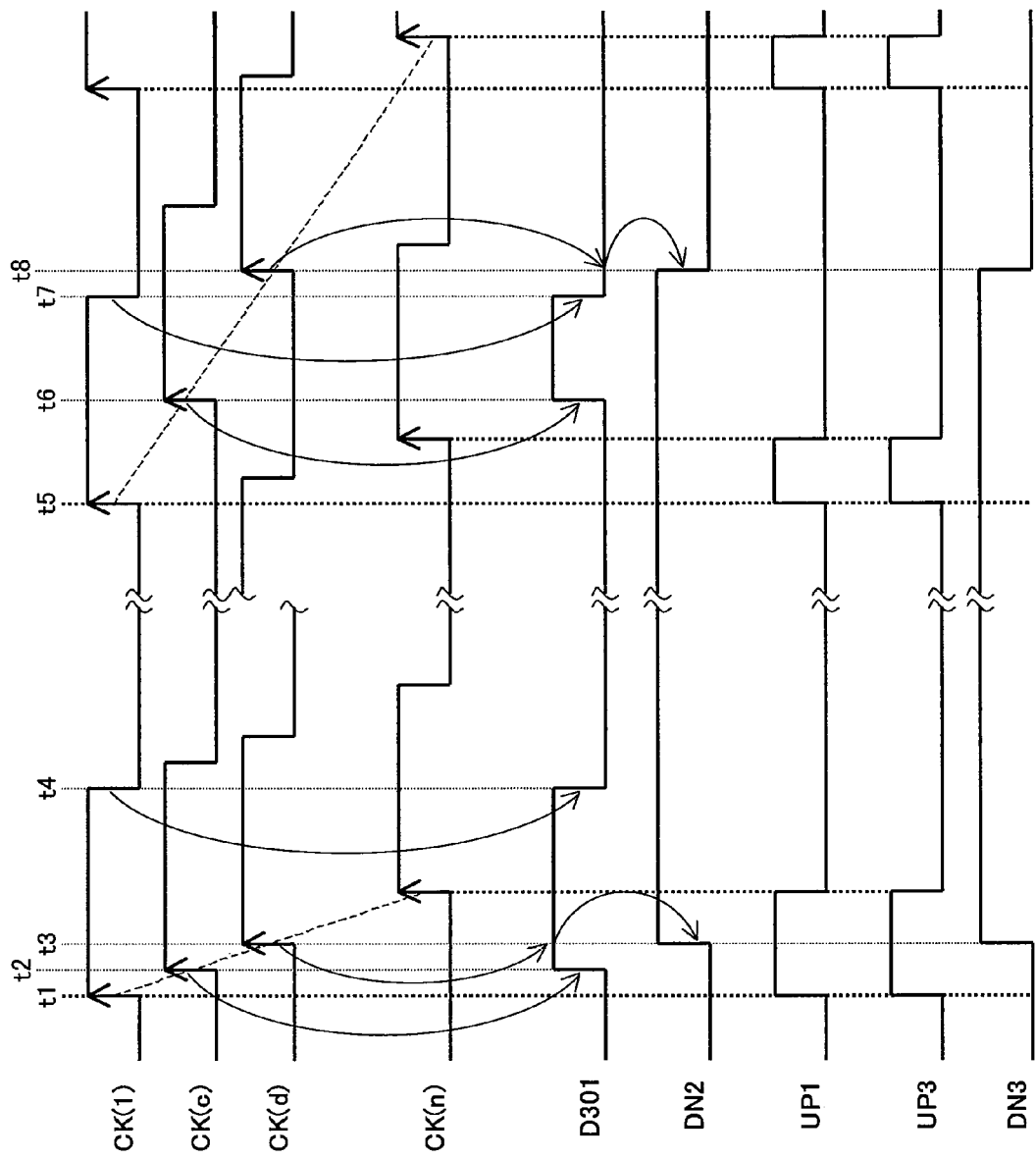
FIG. 13 is a signal waveform diagram for explaining the operation of the DLL circuit shown in FIG. 10.

Next, with reference to FIG. 13, the operation of the DLL circuit 3 shown in FIG. 10 will be described. In FIG. 13, the difference in delay time between the delayed clocks CK(1) and CK(n) is smaller than one cycle of the delayed clock CK(1) during the time interval from a time t1 to a time t4.

At the time t1, the delayed clock CK(1) goes to the high level, and thus the reset of the flip flop 301 is terminated.

At the time t2, the flip flop 301 latches power supply voltage in synchronization with the rising edge of the delayed clock CK(c). This causes the intermediate signal D301 (the output of the flip flop 301) to transition from the low level to the high level.

At the time t3, the flip flop 302 latches the intermediate signal D301 in synchronization with the rising edge of the delayed clock CK(d). This causes the discharge signal DN2 (the output of the flip flop 302) to transition from the low level to the high level.

At the time t4, since the delayed clock CK(1) transitions from the high level to the low level, the flip flop 301 is reset, and the intermediate signal D301 (the output of the flip flop 301) transitions from the high level to the low level.

In this way, when the rising edge of the delayed clock CK(d) occurs during the time interval in which the delayed clock CK(1) is at the high level, the discharge signal DN2 is output. This causes the delay time in the variable delay circuit 10 to be gradually increased during the time interval in which the discharge signal DN2 is output.

Now it is assumed that, during the time interval from the time t4 to a time t5, the delay time in the variable delay circuit 10 sufficiently increases, and consequently the difference in delay time between the delayed clocks CK(1) and CK(n) exceeds one cycle of the delayed clock CK(1).

At the time t5, the delayed clock CK(1) goes to the high level, and the reset of the flip flop 301 is terminated. At a time t6, the rising edge of the delayed clock CK(c) occurs, and the intermediate signal D301 (the output of the flip flop 301) transitions from the low level to the high level.

At a time t7, since the delayed clock CK(1) transitions from the high level to the low level, the flip flop 301 is reset, and the intermediate signal D301 (the output of the flip flop 301) transitions from the high level to the low level.

At a time t8, the flip-flop 302 latches the intermediate signal D301 in synchronization with the rising edge of the delayed clock CK(d). Since the intermediate signal D301 is at the low level, the discharge signal DN2 (the output of the flip-flop 302) transitions from the high level to the low level.

In this manner, when the rising edge of the delayed clock CK(d) occurs during the time interval in which the delayed clock CK(1) is at the low level, the output of the discharge signal DN2 is stopped.

As described above, when the difference in delay time between the delayed clocks CK(1) and CK(n) is insufficient, the delay time in the variable delay circuit 10 is increased gradually. This makes the difference in delay time between the delayed clocks CK(1) and CK(n) approach one cycle, thereby allowing the phase comparison circuit 11 to perform phase comparisons in an appropriate manner. In this way, it becomes possible to stabilize the phase state of the delayed clocks CK(1) and CK(n) in the proper lock state without shaping the clock waveform.

It should be noted that even if the insufficient delay state detection circuit 31 is designed in such a manner that the flip flop 301 latches the power supply voltage in synchronization with the delayed clock CK(d), and the output (D301) of the flip flop 301 is output as the discharge signal DN2, the insufficient delay state is detectable.

(Imaging Device)

Figure 14:
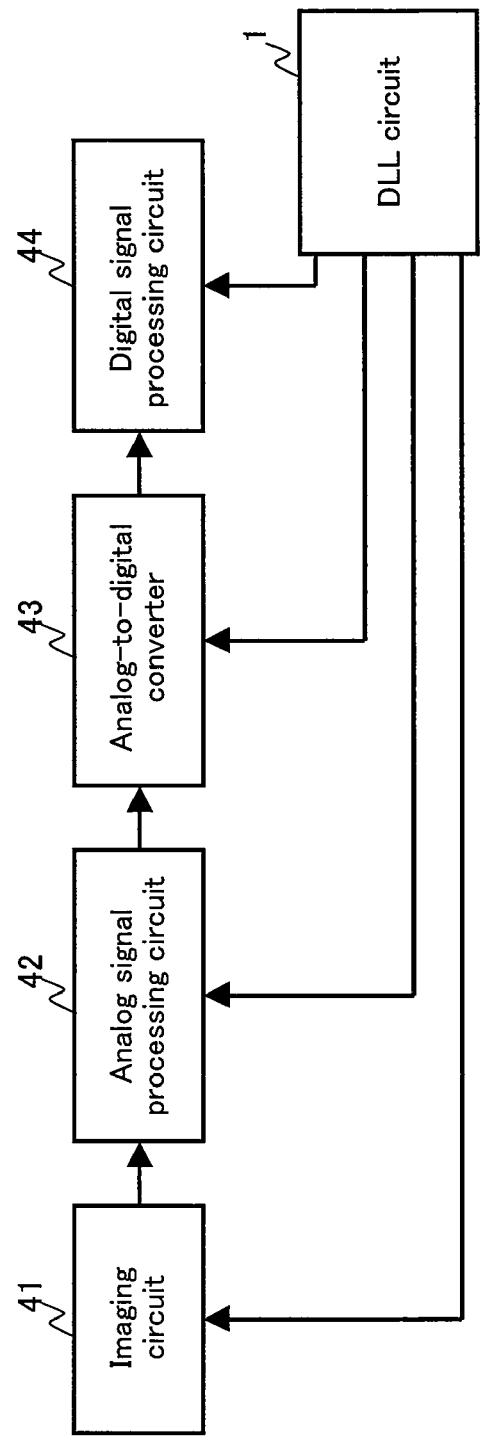
FIG. 14 illustrates the configuration of an imaging device including the DLL circuit shown in FIG. 1.

As shown in FIG. 14, the DLL circuits 1, 2, and 3 according to the foregoing embodiments are applicable to an imaging device. The imaging device shown in FIG. 14 includes an imaging circuit 41, an analog signal processing circuit 42, an analog-to-digital converter 43, and a digital signal processing circuit 44 in addition to the DLL circuit 1.

The imaging circuit 41, which is a CCD sensor, for example, converts an image of an object to an electrical signal. The analog signal processing circuit 42 performs correlated double sampling processing, amplification processing, or the like on the electrical signal obtained by the imaging circuit 41, thereby generating an analog signal indicating a luminance value. The analog-to-digital converter 43, which is a pipeline A/D converter, for example, converts the analog signal obtained by the analog signal processing circuit 42 to a digital signal. The digital signal processing circuit 44 performs digital processing, such as YC separation processing, on the digital signal obtained by the analog-to-digital converter 43. The imaging circuit 41, the analog signal processing circuit 42, the analog-to-digital converter 43, and the digital signal processing circuit 44 operate using the delayed clocks generated by the DLL circuit 1 as operation clocks.

In this manner, by applying the DLL circuit, in which the stability of the proper lock state is high, to the imaging device, imaging processing can be performed accurately.

(Memory Device)

Figure 15:
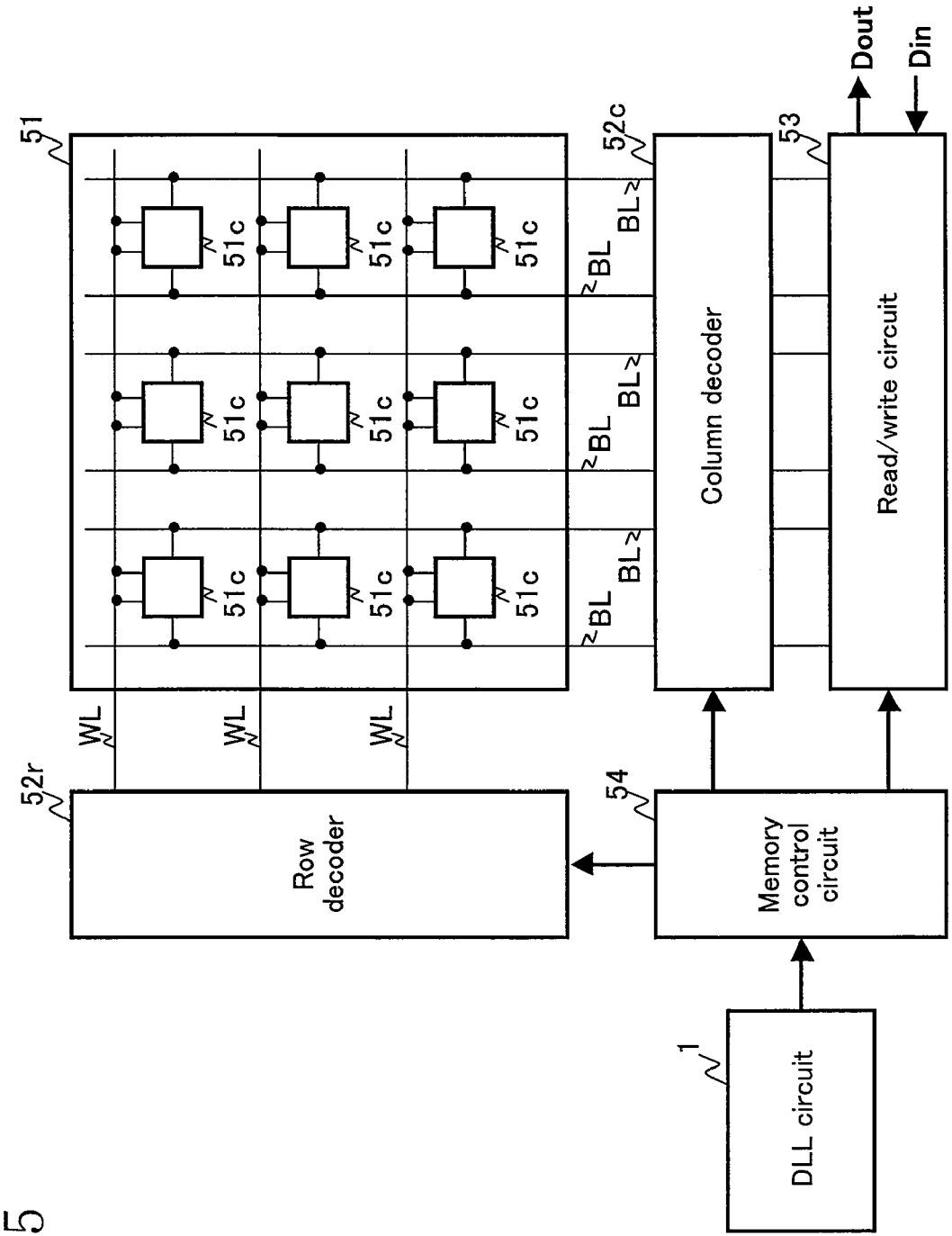
FIG. 15 illustrates the configuration of a memory device including the DLL circuit shown in FIG. 1.

Also, as shown in FIG. 15, the DLL circuits 1, 2, and 3 are applicable to a memory device such as an SRAM. The memory device shown in FIG. 15 includes a memory array 51, a row decoder 52r, a column decoder 52c, a read/write circuit 53, and a memory control circuit 54 in addition to the DLL circuit 1.

The memory array 51 includes a plurality of memory cells 51c, 51c, . . . , which are arranged in a matrix, and word lines WL, WL, . . . and bit lines BL, BL, . . . , which are connected to the memory cells 51c, 51c, . . . . The row decoder 52r activates one of the word lines WL, WL, . . . . The column decoder 52c selects a pair of bit lines BL from the bit lines BL, BL, . . . . In this way, one of the memory cells 51c, 51c, . . . is selected. The read/write circuit 53 reads data Dout from the selected memory cell 51c or writes data Din to the selected memory cell 51c. The memory control circuit 54 outputs an address to each of the row decoder 52r and the column decoder 52c to control the row decoder 52r and the column decoder 52c. The memory control circuit 54 also controls the operation of the read/write circuit 53 by outputting a predetermined instruction to the read/write circuit 53. The memory control circuit 54 operates using a delayed clock generated by the DLL circuit 1 as an operation clock.

As described above, by applying the DLL circuit, in which the stability of the proper lock state is high, to the memory device, the reading/writing of data can be performed accurately.

In the foregoing descriptions, the phases of the delayed clocks CK(1) and CK(n) may be locked so that their phases coincide with each other, or the phases of the delayed clocks CK(1) and CK(n) may be locked with a steady phase error contained therein. In both cases, if the difference in delay time between the delayed clocks CK(1) and CK(n) is equal to one cycle of the delayed clock CK(1), then their phase state is the proper lock state.

The respective duty ratios of the input clock CKin and the delayed clocks CK(1), . . . , CK(k) do not have to be 50%.

As described above, the DLL circuits according to the present invention, in which the stability of the proper lock state is high, are applicable to clock supply circuits, etc. which are incorporated into imaging devices, memory devices, and the like.

What is claimed is:

1. A DLL circuit comprising:
   a variable delay circuit for successively delaying an input clock to generate a plurality of delayed clocks having different phases;
   a phase comparison circuit for receiving a first reference clock, which is either one of the delayed clocks or the input clock, and a second reference clock, which is one of the delayed clocks and whose phase lags behind that of the first reference clock, specifying a validated interval for the second reference clock, and comparing the phases of the first and second reference clocks according to voltage levels of the first and second reference clocks only during the validated interval; and
   a delay control circuit for controlling a delay time in the variable delay circuit according to a result of the comparison obtained by the phase comparison circuit.

2. The circuit of claim 1, wherein when the first reference clock is at an active level and the second reference clock is at an inactive level, the phase comparison circuit outputs a first comparison result indicating that the phase of the second reference clock lags behind that of the first reference clock, and when the first reference clock is at the inactive level and the second reference clock is at the active level, the phase comparison circuit outputs a second comparison result indicating that the phase of the second reference clock leads that of the first reference clock.

3. The circuit of claim 1, wherein the delayed clocks include:
   a first interval specification clock whose phase leads that of the second reference clock by a predetermined amount, and
   a second interval specification clock whose phase lags behind that of the second reference clock by a predetermined amount; and
   the phase comparison circuit receives the first and second interval specification clocks and specifies a time interval between edges of the first and second interval specification clocks as the validated interval.

4. The circuit of claim 1, further comprising an excessive delay state detection circuit for detecting an excessive delay state in which a difference in delay time between the first and second reference clocks is greater than one cycle,
   wherein during a time interval in which the excessive delay state detection circuit detects the excessive delay state, the delay control circuit gradually reduces the delay time in the variable delay circuit irrespective of the comparison result obtained by the phase comparison circuit.

5. The circuit of claim 4, wherein the delayed clocks include first and second excess detection clocks, in which relation in terms of temporal order between the timings of occurrences of edges of the first and second excess detection clocks is reversed when the difference in delay time between the first and second reference clocks transitions from a state in which the delay time difference is one cycle to the excessive delay state; and
   the excessive delay state detection circuit detects the excessive delay state by receiving the first reference clock and the first and second excess detection clocks and detecting that the relation in terms of temporal order between the timings of occurrences of edges of the first and second excess detection clocks has been reversed.

6. The circuit of claim 4, wherein the excessive delay state detection circuit intermittently outputs a result of the detection to the delay control circuit.

7. The circuit of claim 4, further comprising an insufficient delay state detection circuit for detecting an insufficient delay state in which a difference in delay time between the first and second reference clocks is smaller than one cycle,
   wherein the delay control circuit gradually increases the delay time in the variable delay circuit during a time interval in which the insufficient delay state detection circuit detects the insufficient delay state.

8. The circuit of claim 1, further comprising an insufficient delay state detection circuit for detecting an insufficient delay state in which a difference in delay time between the first and second reference clocks is smaller than one cycle,
   wherein the delay control circuit gradually increases the delay time in the variable delay circuit during a time interval in which the insufficient delay state detection circuit detects the insufficient delay state.

9. The circuit of claim 8, wherein the delayed clocks include an insufficiency detection clock, in which, in a state in which the difference in delay time between the first and second reference clocks is one cycle, edges of the insufficiency detection clock occur during time intervals in which the first reference clock is inactive, and in the insufficient delay state, the edges of the insufficiency detection clock occur during time intervals in which the first reference clock is active; and the insufficient delay state detection circuit detects the insufficient delay state by receiving the first reference clock and the insufficiency detection clock and detecting that an edge of the insufficiency detection clock occurs during a time interval in which the first reference clock is active.

10. An imaging device comprising:

the DLL circuit of claim 1;

an imaging circuit for converting an image of an object to an electrical signal;

an analog signal processing circuit for converting the electrical signal obtained by the imaging circuit to an analog signal;

an analog-to-digital converter for converting the analog signal obtained by the analog signal processing circuit to a digital signal; and a digital signal processing circuit for processing the digital signal obtained by the analog-to-digital converter, wherein the imaging circuit, the analog signal processing circuit, the analog-to-digital converter, and the digital signal processing circuit operate using delayed clocks generated by the DLL circuit as operation clocks.

11. A memory device comprising:

the DLL circuit of claim 1;

a memory array including a plurality of memory cells;

a memory cell selection circuit for selecting a memory cell from the memory array;

a read/write circuit for reading data from and writing data to the memory cell selected by the memory cell selection circuit; and a memory control circuit which operates using a delayed clock generated by the DLL circuit as an operation clock and controls the memory cell selection by the memory cell selection circuit and the date read and data write by the read/write circuit.

* * * * *